(12) United States Patent
Lee et al.

(10) Patent No.: US 11,532,639 B2
(45) Date of Patent: Dec. 20, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Sangsoo Lee, Seongnam-si (KR); Chaeho Kim, Seoul (KR); Woosung Lee, Yongin-si (KR); Phil Ouk Nam, Suwon-si (KR); Junggeun Jee, Siheung-si (KR)

(73) Assignee: Samsung Electronics Co., Ltd.

( * ) Notice: Subject to any disclaimer, the term of this patent is extended or adjusted under 35 U.S.C. 154(b) by 262 days.

(21) Appl. No.: 17/036,594

(22) Filed: Sep. 29, 2020

(65) Prior Publication Data

US 2021/0320123 A1   Oct. 14, 2021

(30) Foreign Application Priority Data

Apr. 8, 2020 (KR) .................. 10-2020-0042500

(51) Int. Cl.
| | |
|---|---|
| *H01L 27/11582* | (2017.01) |
| *H01L 27/11519* | (2017.01) |
| *H01L 27/11556* | (2017.01) |
| *H01L 23/535* | (2006.01) |
| *H01L 27/11565* | (2017.01) |
| *H01L 27/11573* | (2017.01) |
| *H01L 27/11529* | (2017.01) |

(52) U.S. Cl.
CPC ...... *H01L 27/11582* (2013.01); *H01L 23/535* (2013.01); *H01L 27/11519* (2013.01); *H01L 27/11529* (2013.01); *H01L 27/11556* (2013.01); *H01L 27/11565* (2013.01); *H01L 27/11573* (2013.01)

(58) Field of Classification Search
CPC ................................................ H01L 27/11582
See application file for complete search history.

(56) References Cited

U.S. PATENT DOCUMENTS

| | | |
|---|---|---|
| 8,987,089 B1 | 3/2015 | Pachamuthu et al. |
| 8,987,805 B2 | 3/2015 | Nam et al. |
| 9,461,061 B2 | 10/2016 | Nam et al. |

(Continued)

FOREIGN PATENT DOCUMENTS

| | | |
|---|---|---|
| KR | 100539583 B1 | 12/2005 |
| KR | 20170000462 A | 1/2017 |

OTHER PUBLICATIONS

Notice of Allowance for U.S. Appl. No. 17/389,497, dated Oct. 29, 2021, 10 pgs.

*Primary Examiner* — Christopher A Johnson
(74) *Attorney, Agent, or Firm* — Myers Bigel, P.A.

(57) ABSTRACT

Disclosed is a three-dimensional semiconductor memory device including a carbon-containing layer on a substrate, a plurality of electrode interlayer dielectric layers and a plurality of electrode layers that are alternately stacked on the carbon-containing layer, a cell vertical pattern that penetrates at least some of the electrode interlayer dielectric layers and the electrode layers, and a semiconductor pattern between the cell vertical pattern and the carbon-containing layer. The substrate includes a plurality of first grains. The semiconductor pattern includes a plurality of second grains. An average size of the second grains is less than an average size of the first grains.

20 Claims, 22 Drawing Sheets

(56) References Cited

U.S. PATENT DOCUMENTS

| | | |
|---|---|---|
| 10,256,252 B1 | 4/2019 | Kanazawa |
| 2002/0184535 A1 | 12/2002 | Moaven |
| 2006/0277341 A1 | 12/2006 | Johnson |
| 2009/0320088 A1 | 12/2009 | Gill |
| 2018/0137589 A1 | 5/2018 | Kenthapadi |
| 2019/0221557 A1 | 7/2019 | Kim et al. |
| 2020/0127081 A1* | 4/2020 | Ishida ............. H01L 21/823487 |
| 2020/0274894 A1 | 8/2020 | Argoeti |

* cited by examiner

US 11,532,639 B2

THREE-DIMENSIONAL SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2020-0042500 filed on Apr. 8, 2020 in the Korean Intellectual Property Office, the disclosure of which is hereby incorporated by reference in its entirety.

BACKGROUND

The present inventive concepts relate to a three-dimensional semiconductor memory device.

Semiconductor devices have been highly integrated to meet high performance and low manufacturing cost demands by customers. Because integration of the semiconductor devices is an important factor in determining product price, high integration is increasingly requested. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with increased reliability.

An object of the present inventive concepts is not limited to the mentioned above, and other objects which have not been mentioned above will be clearly understood to those skilled in the art from the following description.

According to some example embodiments of the present inventive concepts, a three-dimensional semiconductor memory device may include a carbon-containing layer on a substrate, a plurality of electrode interlayer dielectric layers and a plurality of electrode layers that are alternately stacked on the carbon-containing layer; a cell vertical pattern that at least partially penetrates the electrode interlayer dielectric layers and the electrode layers; and a semiconductor pattern between the cell vertical pattern and the carbon-containing layer. The substrate may include a plurality of first grains. The semiconductor pattern may include a plurality of second grains. An average cross-sectional size of the second grains may be less than an average cross-sectional size of the first grains.

According to some example embodiments of the present inventive concepts, a three-dimensional semiconductor memory device may include a peripheral circuit structure, a substrate and a carbon-containing layer that are sequentially stacked on the peripheral circuit structure, a stack structure on the carbon-containing layer, the stack structure including a plurality of electrode interlayer dielectric layers and a plurality of electrode layers that are alternately stacked, a cell vertical pattern that penetrates at least a portion of the stack structure, a gate dielectric layer between the cell vertical pattern and the electrode layers, and a source contact plug spaced apart from the cell vertical pattern, the source contact plug penetrating the stack structure and contacting the carbon-containing layer. A concentration of carbon in the carbon-containing layer may be in a range of about 3 at % to about 15 at %.

According to some example embodiments of the present inventive concepts, a three-dimensional semiconductor memory device may include a peripheral circuit structure, a substrate and a carbon-containing layer that are sequentially stacked on the peripheral circuit structure, a stack structure on the carbon-containing layer, the stack structure including a plurality of electrode interlayer dielectric layers and a plurality of electrode layers that are alternately stacked, a cell vertical pattern that penetrates at least a portion of the stack structure, and a semiconductor pattern between the cell vertical pattern and the carbon-containing layer. Each of the substrate and the semiconductor pattern may include a polycrystalline silicon layer. The substrate may include a plurality of first grain boundaries. The semiconductor pattern may include a plurality of second grain boundaries. A density of the second grain boundaries may be greater than a density of the first grain boundaries.

BRIEF DESCRIPTION OF THE DRAWINGS

FIGS. 5A to 10A illustrate cross-sectional views showing a method of fabricating a three-dimensional semiconductor memory device having the cross-section of FIG. 3A.

FIGS. 5B to 10B illustrate cross-sectional views showing a method of fabricating a three-dimensional semiconductor memory device having the cross-section of FIG. 3B.

DETAILED DESCRIPTION

Some example embodiments of the present inventive concepts will now be described in detail with reference to the accompanying drawings to aid in clearly explaining the present inventive concepts.

Figure 1A:
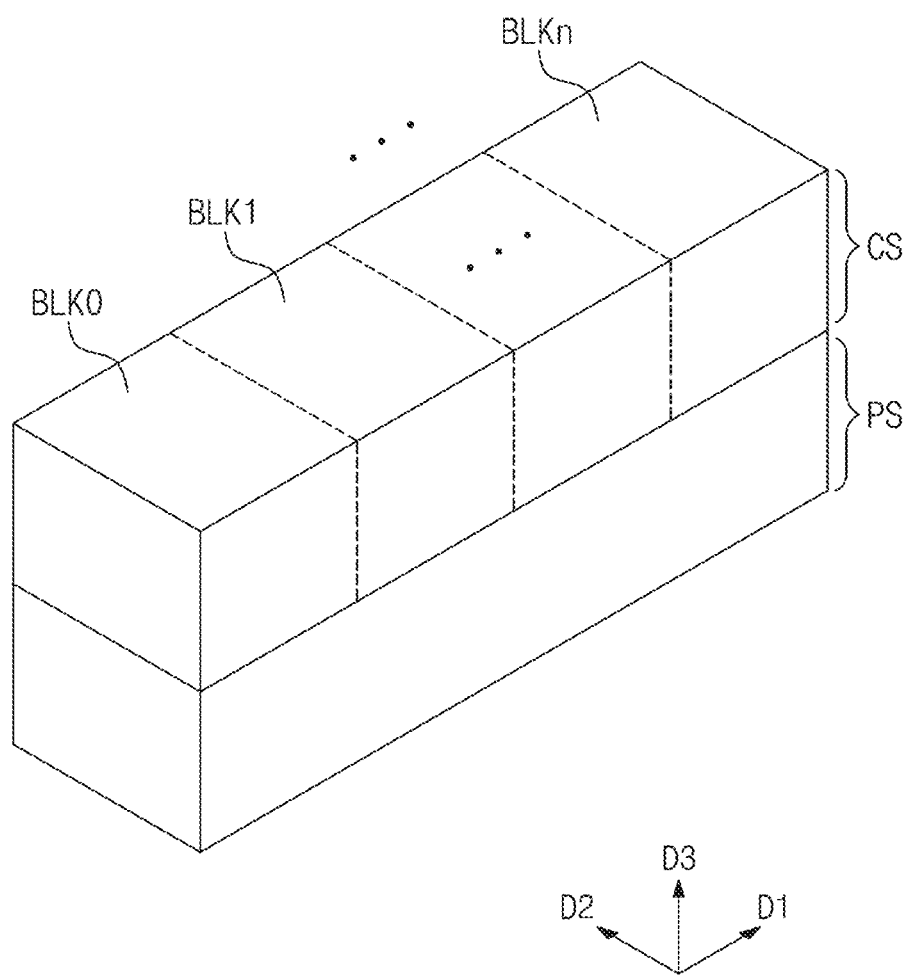
FIG. 1A illustrates a block diagram showing a three-dimensional semiconductor memory device according to some example embodiments of the present inventive concepts.

FIG. 1A illustrates a block diagram showing a three-dimensional semiconductor memory device according to some example embodiments of the present inventive concepts.

Referring to FIG. 1A, a three-dimensional semiconductor memory device according to some example embodiments of the present inventive concepts may include a peripheral circuit structure PS, a cell array structure CS on the peripheral circuit structure PS, and a connection line structure that connects the cell array structure CS to the peripheral circuit structure PS.

The peripheral circuit structure PS may include row and column decoders, a page buffer, and control circuits.

When viewed in a plan view, the cell array structure CS may overlap the peripheral circuit structure PS. The cell array structure CS may include a plurality of memory blocks BLK0 to BLKn, each of which is a data erasure unit. Each of the memory blocks BLK0 to BLKn may include a memory cell array having a three-dimensional structure (or vertical structure).

Figure 1B:
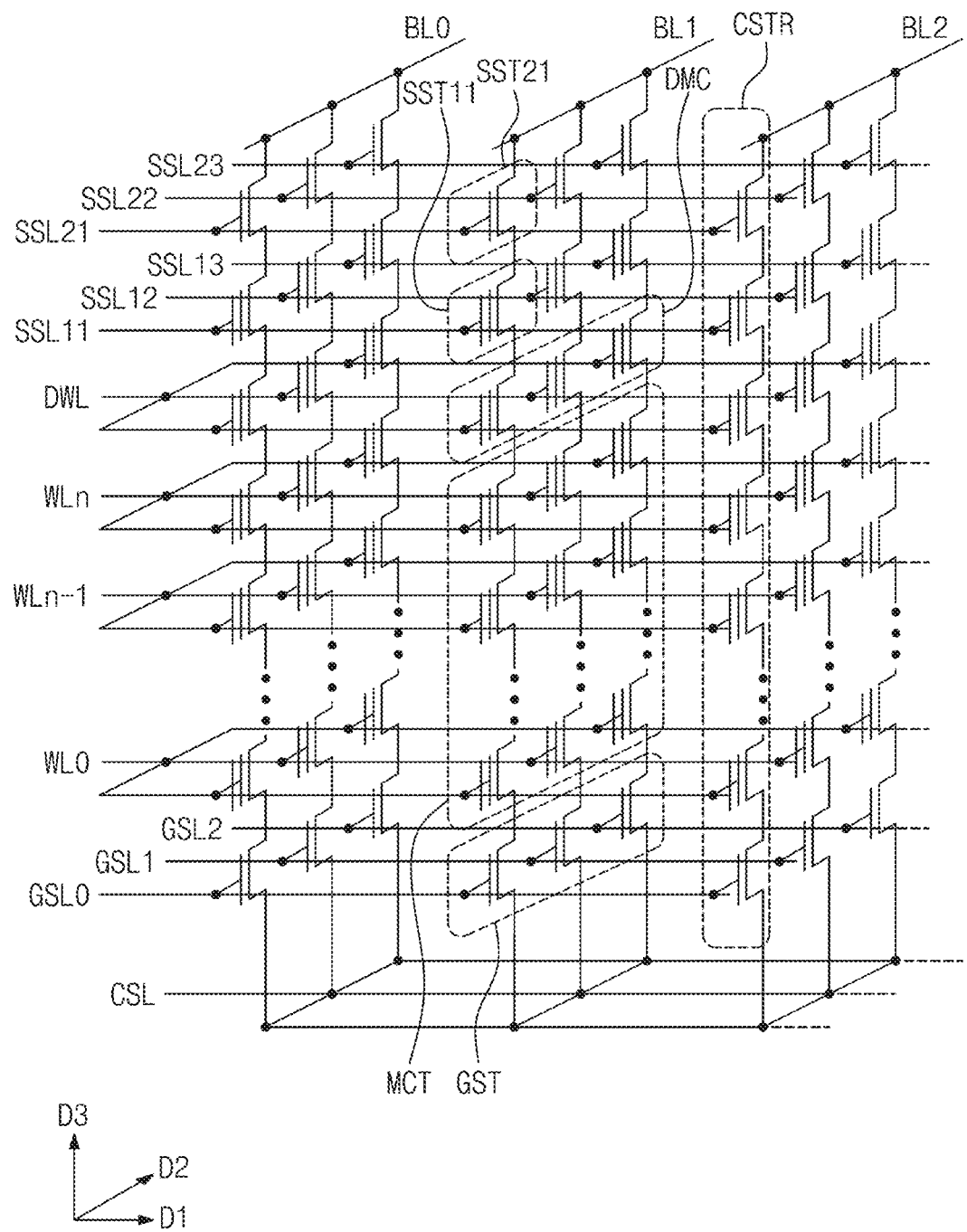
FIG. 1B illustrates a circuit diagram showing a three-dimensional semiconductor memory device according to some example embodiments of the present inventive concepts.

FIG. 1B illustrates a circuit diagram showing a three-dimensional semiconductor memory device according to some example embodiments of the present inventive concepts.

Referring to FIG. 1B, each of the memory blocks BLK0 to BLKn may be configured such that cell strings CSTR are two-dimensionally arranged along first and second directions D1 and D2 and extend along a third direction D3. A plurality of cell strings CSTR may be connected in parallel to each of bit lines BL0 to BL2. A plurality of cell strings CSTR may be connected in common to a common source line CSL.

The bit lines BL0 to BL2 may be arranged two-dimensionally and a plurality of cell strings CSTR may be connected in parallel to each of the bit lines BL0 to BL2. A plurality of cell strings CSTR may be connected in common to the common source line CSL. For example, a plurality of cell strings CSTR may be disposed between a plurality of bit lines BL0 to BL2 and one common source line CSL. The common source line CSL may be provided in plural arranged two-dimensionally. The common source lines CSL may be supplied with the same voltage or may be electrically controlled independently of each other with different voltage sources.

According to some example embodiments, each of the cell strings CSTR may include string selection transistors SST21 and SST11 connected in series, memory cell transistors MCT connected in series, and a ground selection transistor GST. Each of the memory cell transistors MCT may include a data storage element. One of the cell strings CSTR may further include dummy cells DMC between the string selection transistor SST11 and the memory cell transistor MCT and/or between the ground selection transistor GST and the memory cell transistor MCT. Other cell strings CSTR may have an identical or similar structure to that discussed above.

The string selection transistor SST21 may be coupled to a first bit line BL1, and the ground selection transistor GST may be coupled to the common source line CSL. The memory cell transistors MCT connected to one cell string CSTR may be connected in series between, for example, the string selection transistor SST11 and the ground selection transistor GST.

According to some embodiments, in each of the cell strings CSTR, the ground selection transistor GST may include a plurality of MOS transistors connected in series, similar to the string selection transistors SST21 and SST11. Dissimilarly, each of the cell strings CSTR may include a single string selection transistor.

According to some example embodiments, the string selection transistor SST11 may be controlled by a string selection line SSL11, and the string selection transistor SST21 may be controlled by a string selection line SSL21. The memory cell transistors MCT may be controlled by a plurality of word lines WL0 to WLn, and the dummy cells DMC may be controlled by a dummy word line DWL. The ground selection transistor GST may be controlled by a ground selection line GSL. The common source line CSL may be connected in common to sources of the ground selection transistors GST.

One cell string CSTR may include a plurality of memory cell transistors MCT at different distances from the common source line CSL. A plurality of word lines WL0 to WLn and DWL may be disposed between the common source lines CSL and the bit lines BL0 to BL2.

The memory cell transistors MCT may include gate electrodes at substantially the same distance from the common source line CSL, and the gate electrodes may be connected in common to one of the word lines WL0 to WLn and DWL and thus may have the same potential state. In some embodiments, although the gate electrodes of the memory cell transistors MCT are disposed at substantially the same distance from the common source line CSL, the gate electrodes disposed at different rows or columns may be controlled independently of each other.

Figure 2:
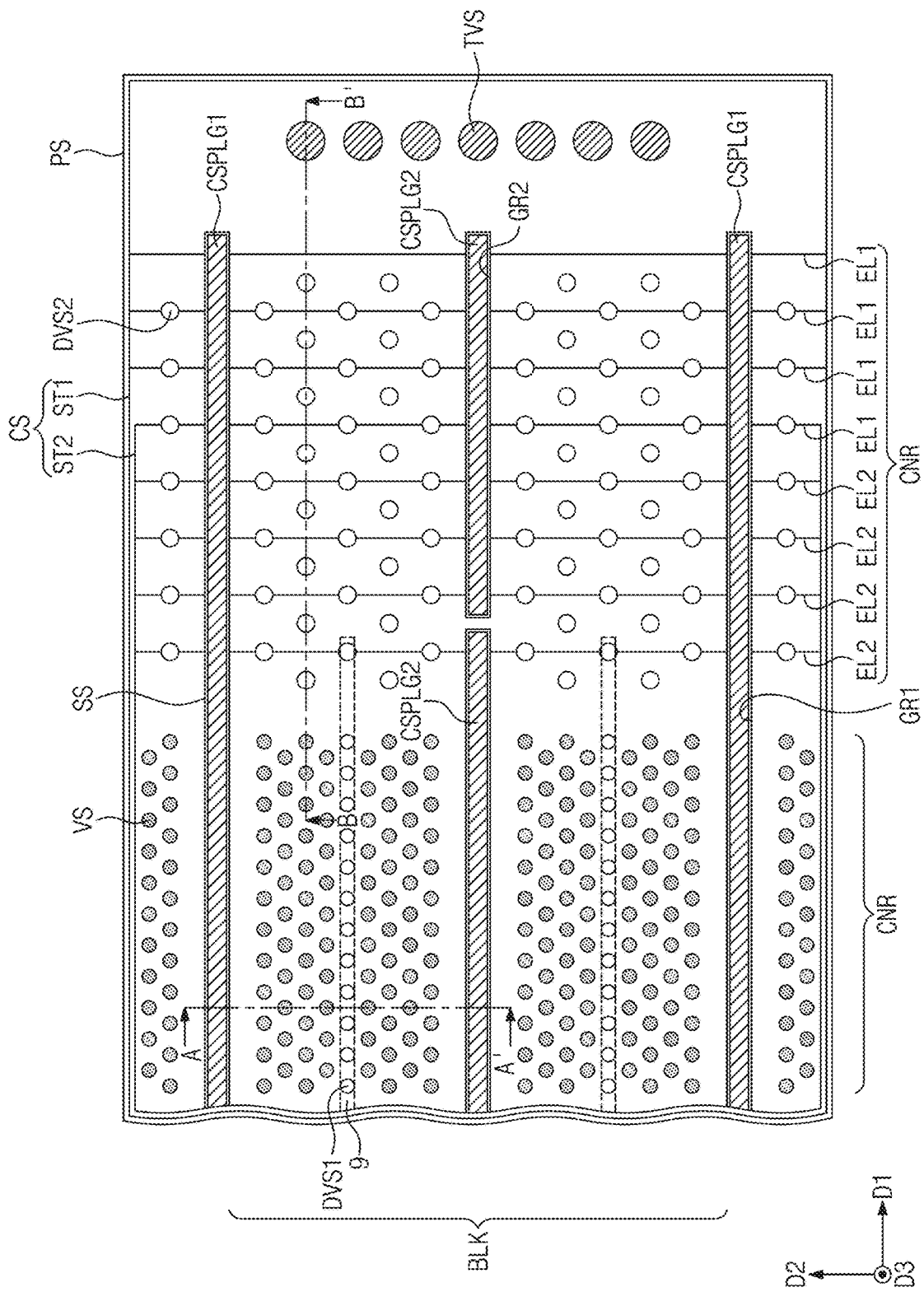
FIG. 2 illustrates a plan view showing a three-dimensional semiconductor memory device according to some example embodiments of the present inventive concepts.
Figure 3A:
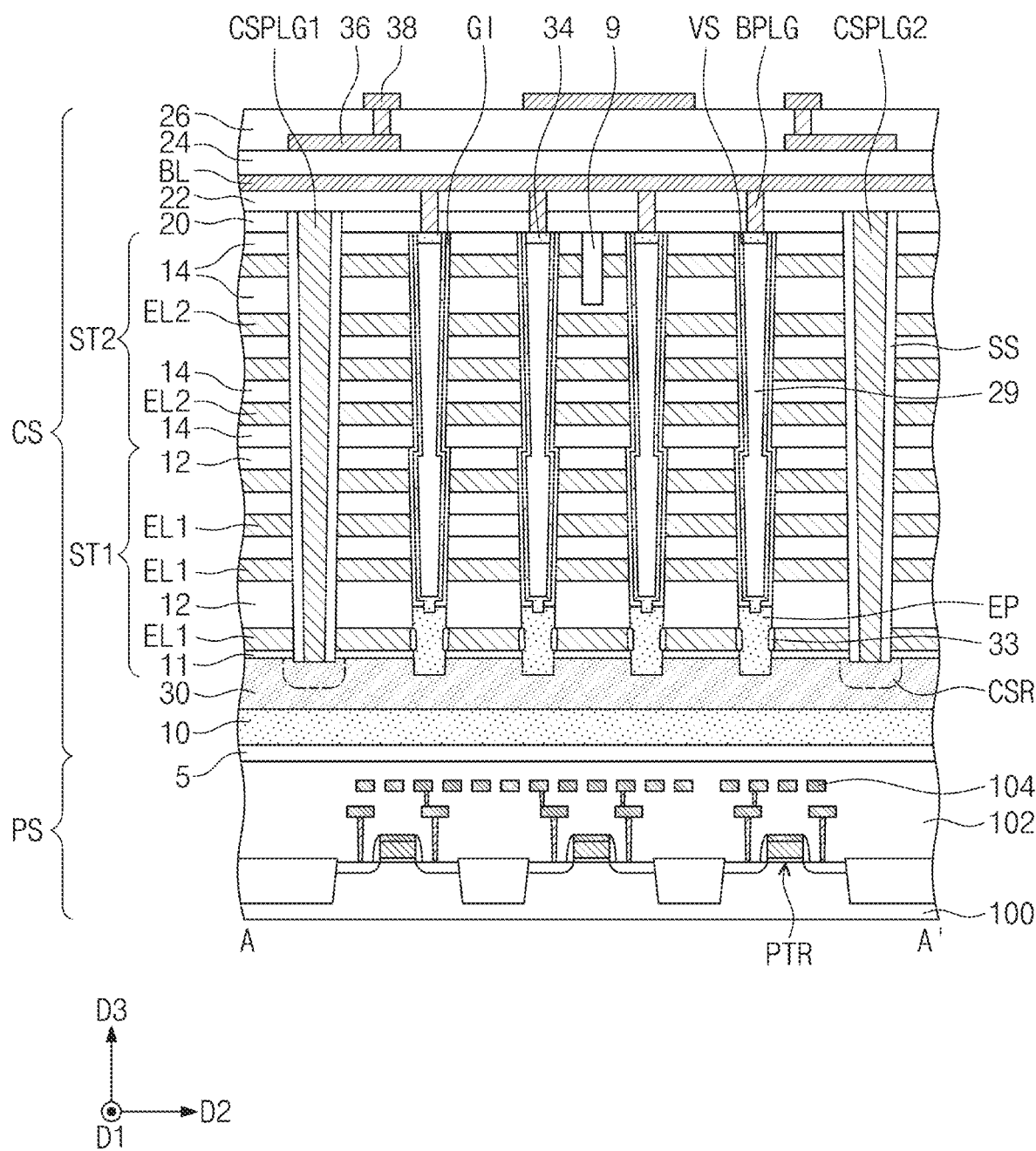
FIG. 3A illustrates a cross-sectional view taken along line A-A' of FIG. 2, showing a three-dimensional semiconductor memory device according to some example embodiments of the present inventive concepts.
Figure 3B:
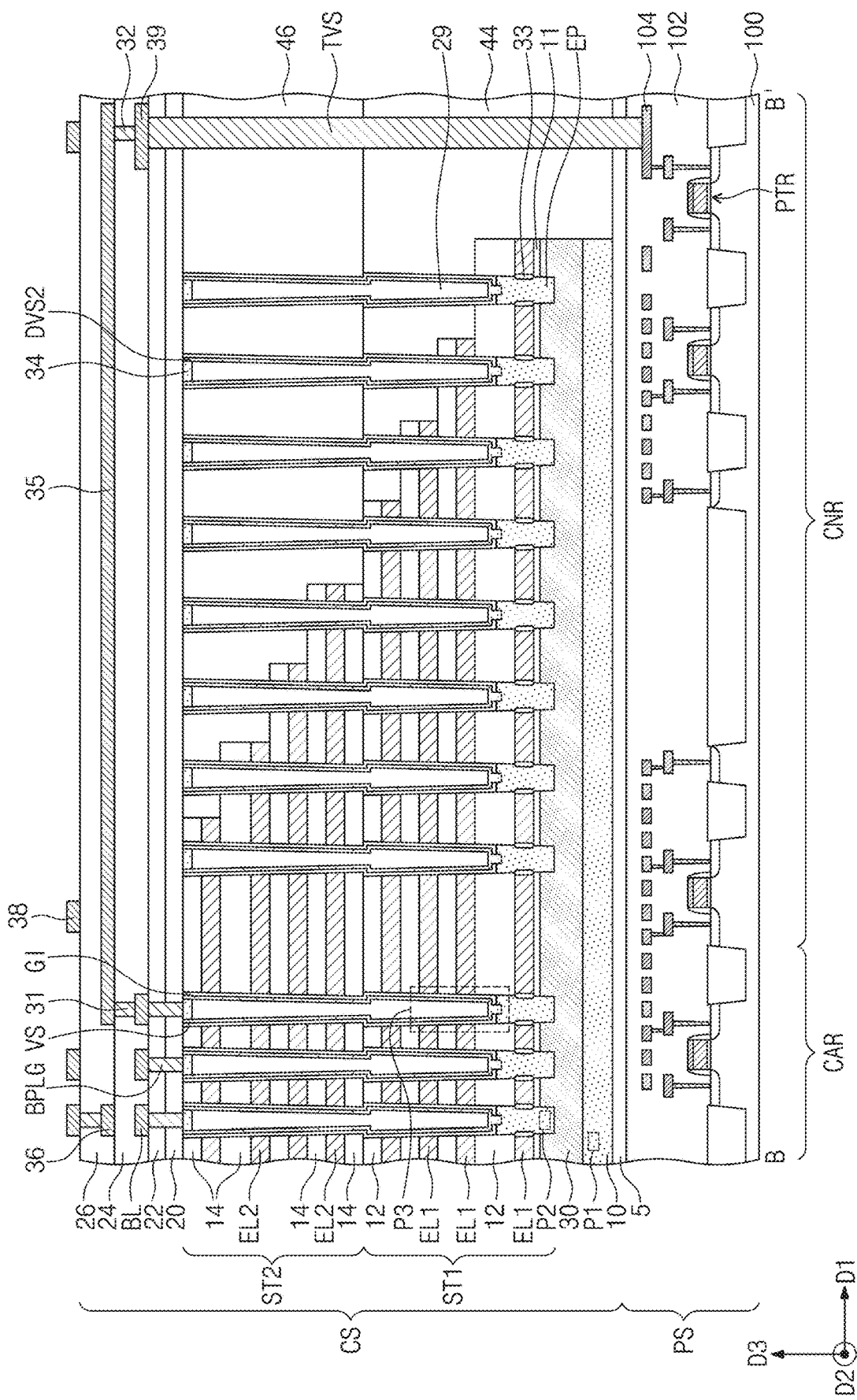
FIG. 3B illustrates a cross-sectional view taken along line B-B' of FIG. 2, showing a three-dimensional semiconductor memory device according to some example embodiments of the present inventive concepts.
Figure 4A:
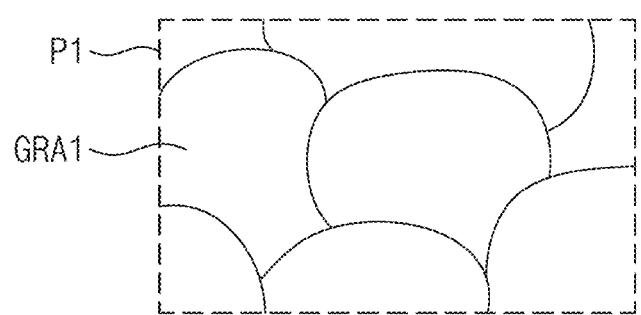
FIG. 4A illustrates an enlarged view showing section P1 of FIG. 3B.
Figure 4B:
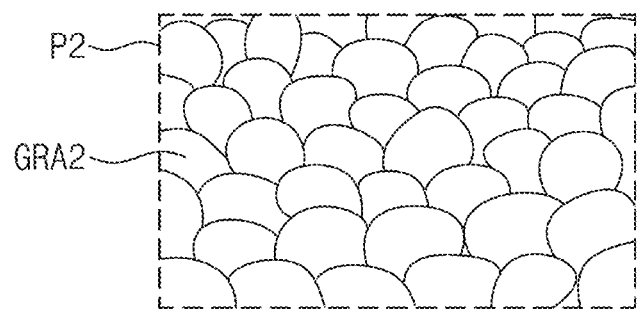
FIG. 4B illustrates an enlarged view showing section P2 of FIG. 3B.
Figure 4C:
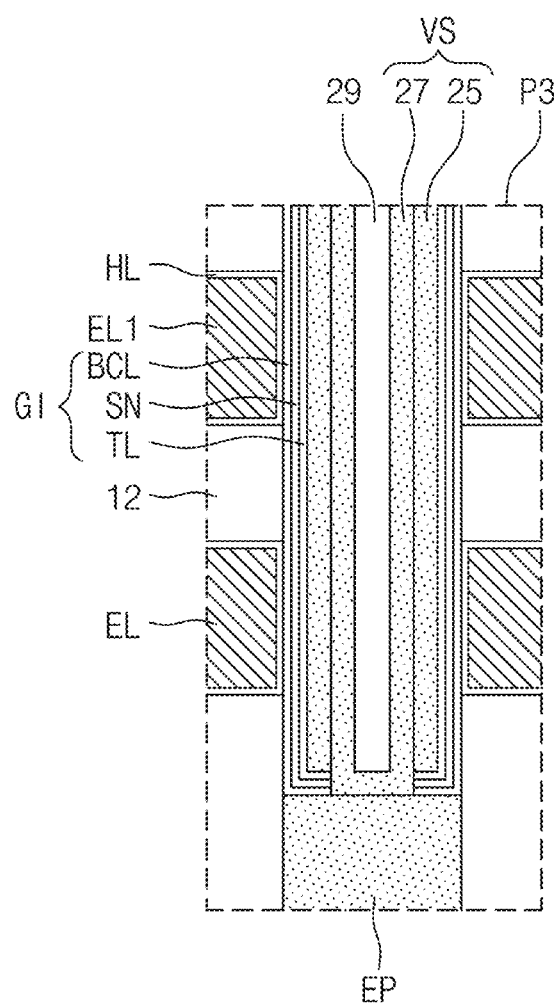
FIG. 4C illustrates an enlarged view showing section P3 of FIG. 3B.

FIG. 2 illustrates a plan view showing a three-dimensional semiconductor memory device according to some example embodiments of the present inventive concepts. FIG. 3A illustrates a cross-sectional view taken along line A-A' of FIG. 2, showing a three-dimensional semiconductor memory device according to some example embodiments of the present inventive concepts. FIG. 3B illustrates a cross-sectional view taken along line B-B' of FIG. 2, showing a three-dimensional semiconductor memory device according to some example embodiments of the present inventive concepts. FIG. 4A illustrates an enlarged view showing section P1 of FIG. 3B. FIG. 4B illustrates an enlarged view showing section P2 of FIG. 3B. FIG. 4C illustrates an enlarged view showing section P3 of FIG. 3B.

Referring to FIGS. 2, 3A, and 3B, a cell array structure CS may be stacked on a peripheral circuit structure PS. The peripheral circuit structure PS may include peripheral circuit transistors PTR disposed on a peripheral circuit substrate 100, a peripheral interlayer dielectric layer 102 that covers or overlaps the peripheral circuit transistors PTR, and peripheral wiring lines 104 disposed in the peripheral interlayer dielectric layer 102. An adhesive dielectric layer 5 may be disposed on the peripheral interlayer dielectric layer 102. The adhesive dielectric layer 5 may include at least one selected from a silicon oxide layer, a silicon nitride layer, and a silicon oxynitride layer. The peripheral circuit transistors PTR and the peripheral wiring lines 104 may include row and column decoders, a page buffer, and/or control circuits.

The cell array structure CS may be stacked on the adhesive dielectric layer 5. The cell array structure CS may include a cell substrate 10. The cell substrate 10 may be formed of a semiconductor layer, for example, a polysilicon layer (or polycrystalline silicon layer). The cell substrate 10 may be doped with N-type or P-type impurities. The cell substrate 10 may have a bi-layered structure consisting of an impurity-undoped polysilicon layer and an N-type or P-type impurity-doped layer. The cell substrate 10 may include a cell region CAR and a connection region CNR that are arranged side by side along a first direction D1. The cell array structure CS may include a plurality of memory blocks BLK0 to BLKn of FIG. 1A, and FIG. 2 shows a plan view of one memory block BLK selected from the plurality of memory blocks BLK0 to BLKn. First source contact plugs CSPLG1 may be disposed between neighboring memory blocks BLK. In addition, a second source contact plug CSPLG2 may be disposed on a central portion of one memory block BLK and may divide one memory block BLK into two compartments in a second direction D2.

As shown in the plan view of FIG. 2, the first source contact plug CSPLG1 may have a linear shape that is continuously elongated in the first direction D1. In contrast, the second source contact plug CSPLG2 may have a discontinuous section (or cut area) on the connection region CNR. The memory block BLK and the first and second source contact plugs CSPLG1 and CSPLG2 may have therebetween dielectric spacers SS formed of a dielectric material. The first and second source contact plugs CSPLG1 and CSPLG2 may include, for example, at least one selected from doped semiconductor materials (e.g., doped silicon), metals (e.g., tungsten, copper, or aluminum), conductive metal nitrides (e.g., titanium nitride or tantalum nitride), and transition metals (e.g., titanium or tantalum).

A carbon-containing layer 30 may be disposed on the cell substrate 10. The carbon-containing layer 30 may include carbon and/or one or more other elements. For example, the carbon-containing layer 30 may be a carbon-doped silicon layer. The carbon may be doped at a concentration of from about 3 at % to about 15 at %. A first stack structure ST1 and a second stack structure ST2 may be sequentially stacked on the carbon-containing layer 30.

The first stack structure ST1 may include a buffer dielectric layer 11, and may also include first electrode layers EL1 and first electrode interlayer dielectric layers 12 that are alternately stacked. The second stack structure ST2 may include second electrode layers EL2 and second electrode interlayer dielectric layers 14 that are alternately stacked. The buffer dielectric layer 11 may have a single-layered or multi-layered structure including, for example, at least one selected from a silicon oxide layer, a silicon nitride layer, and a silicon oxynitride layer. The first and second electrode layers EL1 and EL2 may contain metal, for example, tungsten. The first and second electrode interlayer dielectric layers 12 and 14 may include, for example, a silicon oxide layer. The first stack structure ST1 and the second stack structure ST2 may have therein a first groove GR1 and a second groove GR2 that penetrate therethrough and are spaced apart from each other. The first source contact plug CSPLG1 may be disposed in the first groove GR1, and the second source contact plug CSPLG2 may be disposed in the second groove GR2.

The first and second electrode layers EL1 and EL2 may have their end portions (or pad portions) that include a stepwise structure on the connection region CNR. For example, the first and second electrode layers EL1 and EL2 may have their lengths in the first direction D1 that decrease with increasing distance from the cell substrate 10, and the first and second stack structures ST1 and ST2 may have their heights that decrease with increasing distance from the cell region CAR. In addition, on the connection region CNR, the first and second electrode layers EL1 and EL2 may have their sidewalls that are disposed spaced apart at a regular interval from each other in the first direction D1. Each of the first and second electrode layers EL1 and EL2 may have a pad portion on the connection region CNR, and the pad portions of the first and second electrode layers EL1 and EL2 may be horizontally and vertically located at different positions. A separation dielectric pattern 9 may divide an uppermost second electrode layer EL2 into a plurality of line patterns that extend in the first direction D1, and the line patterns may correspond to the string selection lines SSL11, SSL12, and SSL13 shown in FIG. 1B.

According to some example embodiments, a vertical NAND Flash memory device may be adopted as a three-dimensional semiconductor memory device of the present inventive concepts. For example, a lowermost one of the first electrode layers EL1 may correspond to the ground selection lines GSL0 to GSL2 of FIG. 1B. First and second electrode layers EL1 and EL2, other than lowermost ones of the first and second electrode layers EL1 and EL2, may correspond to the word lines WL0 to WLn and the dummy word line DWL of FIG. 1B. On the connection region CNR, the first stack structure ST1 may have an end portion covered with or overlapped by a first planarized dielectric layer 44, and the second stack structure ST2 may have an end portion covered with or overlapped by a second planarized dielectric layer 46. The first and second planarized dielectric layers 44 and 46 may include the same dielectric material as that of the first and second electrode interlayer dielectric layers 12 and 14.

Referring to FIGS. 2 and 3A, on the cell region CAR, a plurality of cell vertical patterns VS may penetrate the second stack structure ST2 and a portion of the first stack structure ST1. Although not shown in FIG. 3A but illustrated in FIG. 2, the cell region CAR may include first dummy vertical patterns DVS1 between the cell vertical patterns VS. The first dummy vertical patterns DVS1 may be linearly disposed along the first direction D1 on a central portion of one section of the memory block BLK. A plurality of separation dielectric patterns 9 may be disposed between upper portions of the first dummy vertical patterns DVS1. The separation dielectric patterns 9 may include the same dielectric material as that of the first and second electrode interlayer dielectric layers 12 and 14.

Referring to FIGS. 2 and 3B, the connection region CNR may include a plurality of second dummy vertical patterns DVS2 that penetrate the second stack structure ST2 and a portion of the first stack structure ST1. The second dummy vertical patterns DVS2 each may have their widths greater than those of ones of the cell vertical patterns VS and widths of ones of the first dummy vertical patterns DVS1.

As shown in FIG. 4C, the cell vertical patterns VS and/or the first and second dummy vertical patterns DVS1 and DVS2 may each include a first vertical pattern 25 and a second vertical pattern 27. The second vertical pattern 27 may penetrate a gate dielectric layer GI and may contact a semiconductor pattern EP. The first vertical pattern 25 may be interposed between the second vertical pattern 27 and the gate dielectric layer GI. The first and second vertical patterns 25 and 27 may all include an impurity-doped single-crystalline silicon layer, an impurity-undoped single-crystalline silicon layer, and/or a polysilicon layer (or polycrystalline silicon layer). The cell vertical patterns VS and the first and second dummy vertical patterns DVS1 and DVS2 may each have a hollow shell shape.

As shown in FIGS. 3A and 3B, the cell vertical patterns VS and the first and second dummy vertical patterns DVS1 and DVS2 may have their respective cross-sections, each of which has a shape that is broken (or bent) at a location adjacent to a boundary between the first stack structure ST1 and the second stack structure ST2. For example, the cell vertical patterns VS and the first and second dummy vertical patterns DVS1 and DVS2 may have their sidewalls such that each has an inflection point at the location adjacent to the boundary between the first stack structure ST1 and the second stack structure ST2. The cell vertical patterns VS and the first and second dummy vertical patterns DVS1 and DVS2 may have their respective insides at least partially filled with a buried dielectric pattern 29.

The semiconductor pattern EP may be disposed between the carbon-containing layer 30 and each of the cell vertical patterns VS and between the carbon-containing layer 30 and respective ones of the first and second dummy vertical patterns DVS1 and DVS2. The semiconductor patterns EP may be formed of, for example, a semiconductor epitaxial layer, a single-crystalline silicon layer, and/or a polysilicon layer (or polycrystalline silicon layer). The semiconductor patterns EP may be doped with N-type or P-type impurities. The semiconductor patterns EP may penetrate at least one of the first electrode layers ELL The semiconductor patterns EP may contact the carbon-containing layer 30. The carbon-containing layer 30 may contact bottom surfaces and lower sidewalls of the semiconductor patterns EP.

Referring to FIGS. 3B, 4A, and 4B, the cell substrate 10 and the semiconductor patterns EP may all be formed of a polycrystalline semiconductor layer such as, for example, a polycrystalline silicon layer. The cell substrate 10 and the semiconductor patterns EP may include silicon grains. For example, as shown in FIG. 4A, the cell substrate 10 may include first grains GRA1. As shown in FIG. 4B, the semiconductor pattern EP may include second grains GRA2. The second grains GRA2 may have an average size less than that of the first grains GRA1. For example, the first grains GRA1 may have an average cross-sectional size (e.g., diameter) of about 50 nm to about 400 nm. The second grains GRA2 may have an average cross-sectional size (e.g., diameter) of about 8 nm to about 12 nm. As shown in FIG. 4A, the cell substrate 10 may include first grain boundaries, or boundaries between the first grains GRA1. As shown in FIG. 4B, the semiconductor pattern EP may include second grain boundaries, or boundaries between the second grains GRA2. The number of the second grain boundaries may be greater than that of the first grain boundaries. The second grain boundaries may have a density greater than that of the first grain boundaries. In other words, the number of second grains GRA2 in a given volume of the semiconductor pattern EP may be greater than the number of first grains GRA1 in a similar volume of the cell substrate 10.

The second grains GRA2 may have uniformity superior to that of the first grains GRA1. For example, the second grains GRA2 may have more regular sizes than those of the first grains GRA1. As such, an increase in uniformity of the second grains GRA2 included in the semiconductor patterns EP may reduce a distribution in sizes of the semiconductor patterns EP. Accordingly, it may be possible to prevent issues such as worst programming characteristics called "worst on cell current" and to increase reliability of semiconductor memory devices.

Although not shown, the cell vertical patterns VS and the first and second dummy vertical patterns DVS1 and DVS2 may all include a polycrystalline semiconductor layer (e.g., polycrystalline silicon layer), and likewise the semiconductor patterns EP, may all include the second grains GRA2 as illustrated in FIG. 4B. In addition, silicon grains in the carbon-containing layer 30 may have their sizes less than those of the first grains GRA1 shown in FIG. 4A and the same as or similar to those of the second grains GRA2 shown in FIG. 4B. The carbon-containing layer 30 may be configured such that carbons are bonded between silicon grains.

Referring to FIGS. 3B and 4C, the gate dielectric layer GI may be interposed between each of the cell vertical patterns VS and the first and second stack structures ST1 and ST2 and between each of the first and second dummy vertical patterns DVS1 and DVS2 and the first and second stack structures ST1 and ST2. As shown in FIG. 4C, the gate dielectric layer GI may include a tunnel dielectric layer TL, a charge storage layer SN, and a blocking dielectric layer BCL. The charge storage layer SN may be a trap dielectric layer, a floating gate electrode, or a dielectric layer including conductive nano-dots. For example, the charge storage layer SN may include at least one selected from a silicon nitride layer, a silicon oxynitride layer, a silicon-rich nitride layer, a nano-crystalline silicon layer, or a laminated trap layer. The tunnel dielectric layer TL may include one of materials each having a bandgap greater than that of the charge storage layer SN, and the blocking dielectric layer BCL may include a high-k dielectric layer such as an aluminum oxide layer or a hafnium oxide layer. A high-k dielectric layer HL may be interposed between the gate dielectric layer GI and each of the first and second electrode layers EL1 and EL2. The high-k dielectric layer HL may include a metal oxide layer, such as an aluminum oxide layer and a hafnium oxide layer. The high-k dielectric layer HL may extend to intervene between each of the first and second electrode layers EL1 and EL2 and each of the first and second electrode interlayer dielectric layers 12 and 14.

The gate dielectric layers GI may partially cover corresponding top surfaces of the semiconductor patterns EP. The cell vertical patterns VS, the first dummy vertical patterns DVS1, and the second dummy vertical patterns DVS2 may each penetrate the gate dielectric layer GI and may contact the semiconductor pattern EP.

Referring to FIG. 3B, a bit-line conductive pad 34 may be provided on each of top ends of the cell vertical patterns VS and the first and second dummy vertical patterns DVS1 and DVS2. The bit-line conductive pad 34 may be an impurity-doped region or may be formed of a conductive material. The bit-line conductive pads 34 on the cell vertical patterns VS may be connected to a bit line BL. The bit-line conductive pads 34 on the first and second dummy vertical patterns DVS1 and DVS2 may not be connected to the bit line BL. A ground gate dielectric layer 33 may be interposed between the semiconductor pattern EP and a lowermost one of the first electrode layers EL1. The ground gate dielectric layer 33 may include, for example, a silicon oxide layer.

Referring to FIGS. 3A and 3B, a first interlayer dielectric layer 20 and a second interlayer dielectric layer 22 may be sequentially stacked on the second stack structure ST2. The first and second source contact plugs CSPLG1 and CSPLG2 and the dielectric spacer SS may penetrate the first interlayer dielectric layer 20, the second stack structure ST2, and the first stack structure ST1, thereby contacting the carbon-containing layer 30. A common source region CSR may be disposed in the carbon-containing layer 30 below the first and second source contact plugs CSPLG1 and CSPLG2. The common source region CSR may be doped with N-type or P-type impurities.

The bit lines BL may be disposed on the second interlayer dielectric layer 22. The bit lines BL may be electrically connected to the bit-line conductive pads 34 on the cell vertical patterns VS through bit-line plugs BPLG that penetrate the second interlayer dielectric layer 22 and the first interlayer dielectric layer 20. On the connection region CNR, a through via TVS may penetrate the second interlayer dielectric layer 22, the first interlayer dielectric layer 20, the second planarized dielectric layer 46, the first planarized dielectric layer 44, the adhesive dielectric layer 5, and a portion of the peripheral interlayer dielectric layer 102, thereby contacting one of the peripheral wiring lines 104. A conductive pad 39 may be positioned on the through via TVS. The bit lines BL may be covered with a third interlayer dielectric layer 24. A bit-line connection line 35 may be positioned on the third interlayer dielectric layer 24. The bit-line connection line 35 may electrically connect one of the bit lines BL to the through via TVS through a first contact plug 31 and a second contact plugs 32 that penetrate the third interlayer dielectric layer 24. Therefore, the bit lines BL may be electrically connected to the peripheral circuit structure PS (e.g., a page buffer circuit). Although not shown, the through via TVS may be provided in plural. One or more of the through vias TVS may be electrically connected to the end portions of the first and second electrode layers EL1 and EL2. The first and second electrode layers EL1 and EL2 may be electrically connected to, for example, row and column decoder circuits of the peripheral circuit structure PS. The third interlayer dielectric layer 24 may be provided thereon with a first cell wiring line 36 spaced apart from the bit-line connection line 35. The bit-line connection line 35 and the first cell wiring line 36 may be covered with or overlapped by a fourth interlayer dielectric layer 26. A plurality of second cell wiring lines 38 may be disposed on the fourth interlayer dielectric layer 26.

FIGS. 5A to 10A illustrate cross-sectional views showing a method of fabricating a three-dimensional semiconductor memory device having the cross-section of FIG. 3A. FIGS. 5B to 10B illustrate cross-sectional views showing a method of fabricating a three-dimensional semiconductor memory device having the cross-section of FIG. 3B.

Figure 5A:
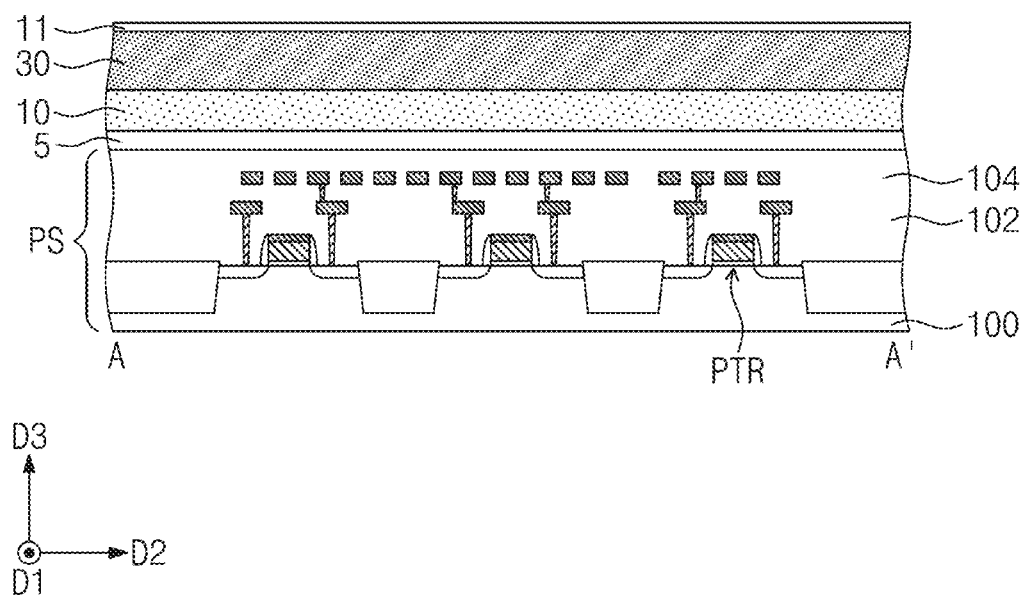
Figure 5B:
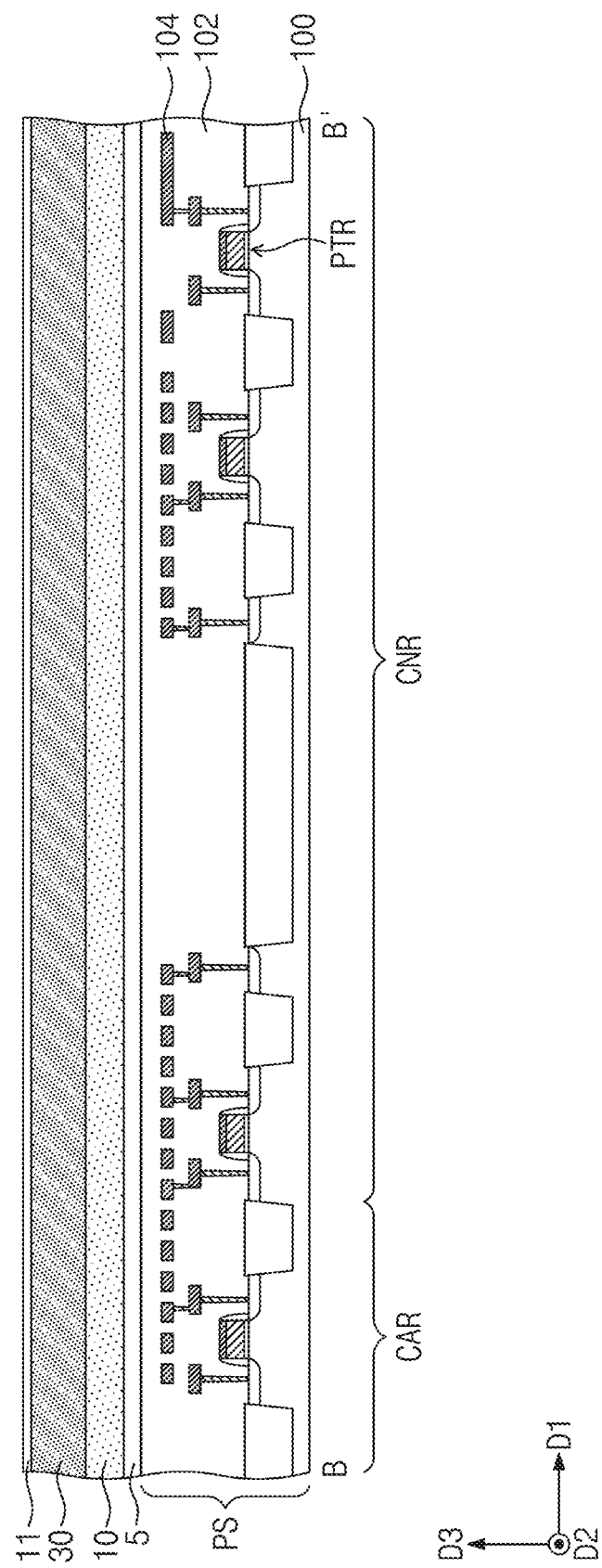

Referring to FIGS. 5A and 5B, a peripheral circuit structure PS may be formed. The formation of the peripheral circuit structure PS may include forming peripheral circuit transistors PTR on a peripheral circuit substrate 100, forming peripheral wiring lines 104 electrically connected to the peripheral circuit transistors PTR, and then forming a peripheral interlayer dielectric layer 102 that covers or overlaps the peripheral circuit transistors PTR. An adhesive dielectric layer 5 may be formed on the peripheral interlayer dielectric layer 102. A cell substrate 10 may be formed on the adhesive dielectric layer 5. The cell substrate 10 may be formed by depositing an amorphous silicon layer. A carbon-containing layer 30 may be formed on the cell substrate 10. The carbon-containing layer 30 may be formed of a carbon-doped semiconductor layer. For example, the carbon-containing layer 30 may be formed of a carbon-doped silicon layer. The carbon-containing layer 30 may be formed by depositing an amorphous silicon layer and simultaneously performing in-situ carbon doping. Alternatively, the carbon-containing layer 30 may be formed by depositing an amorphous silicon layer, and then performing an ion implantation process or a gas-phase doping process to implant the amorphous silicon layer with carbon. The carbon-containing layer 30 may be doped with carbon at a concentration of about 3 at % to about 15 at %. For example, the carbon-containing layer 30 may include carbon whose concentration is in a range of about 3 at % to about 15 at %. After the formation of the carbon-containing layer 30, an annealing process may be performed to replace the amorphous silicon layer included in the cell substrate 10 with a polycrystalline silicon layer. Therefore, the cell substrate 10 may have the first grains GRA1 shown in FIG. 4A. The carbon-containing layer 30 may be changed into a polysilicon layer in which carbon is uniformly doped. The doped carbon may suppress silicon grains in the carbon-containing layer 30 from growing into large sizes, and thus the silicon grains may have small sizes. For example, the silicon grains in the carbon-containing layer 30 may have their sizes less than those of the first grains GRA1 shown in FIG. 4A and the same as or similar to those of the second grains GRA2 shown in FIG. 4B. A buffer dielectric layer 11 may be formed on the carbon-containing layer 30 using a deposition process or a thermal oxidation process. The annealing process may use a furnace, a rapid thermal process, or a laser. The cell substrate 10 may include a cell region CAR and a connection region CNR.

Figure 6A:
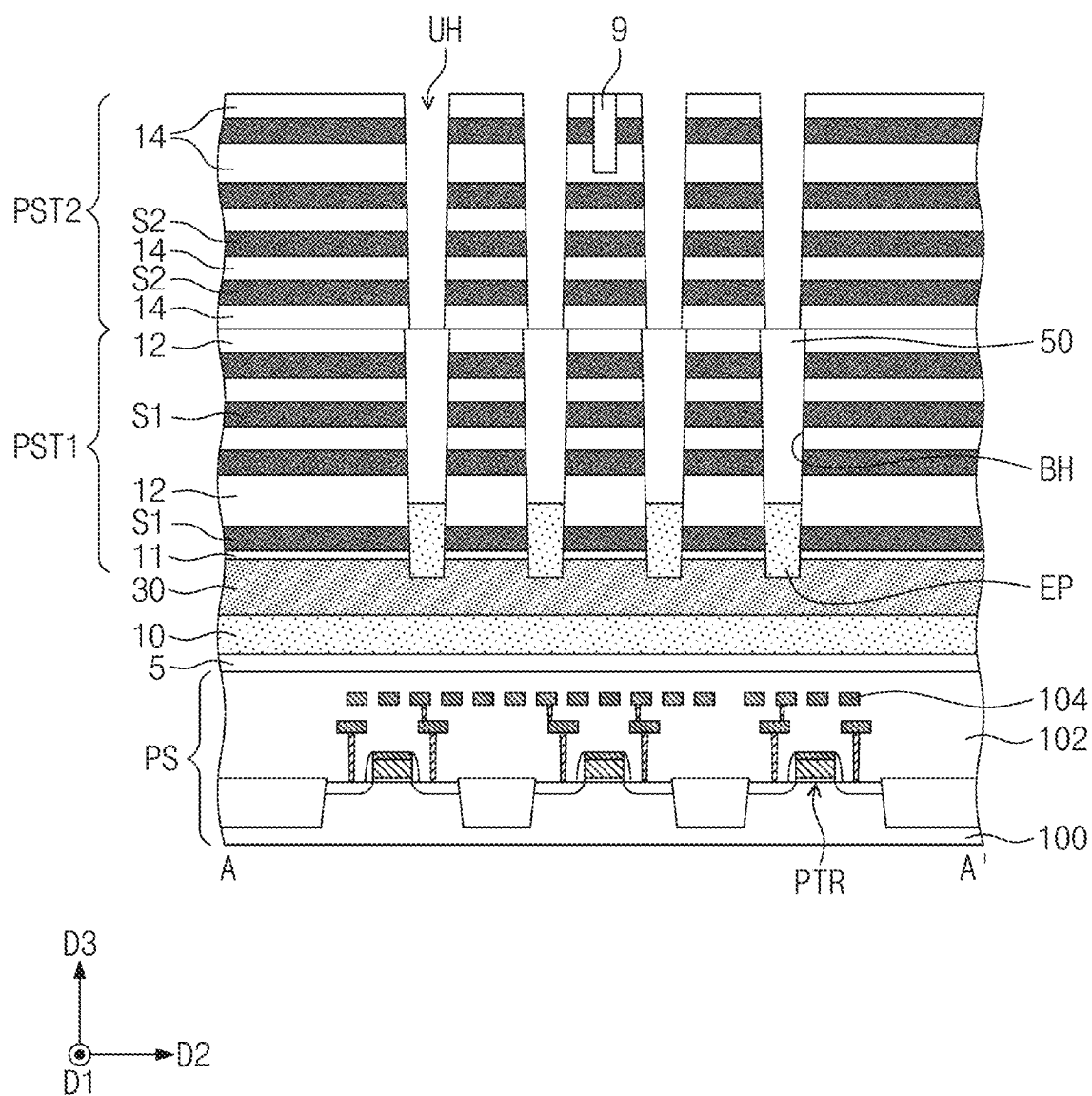
Figure 6B:
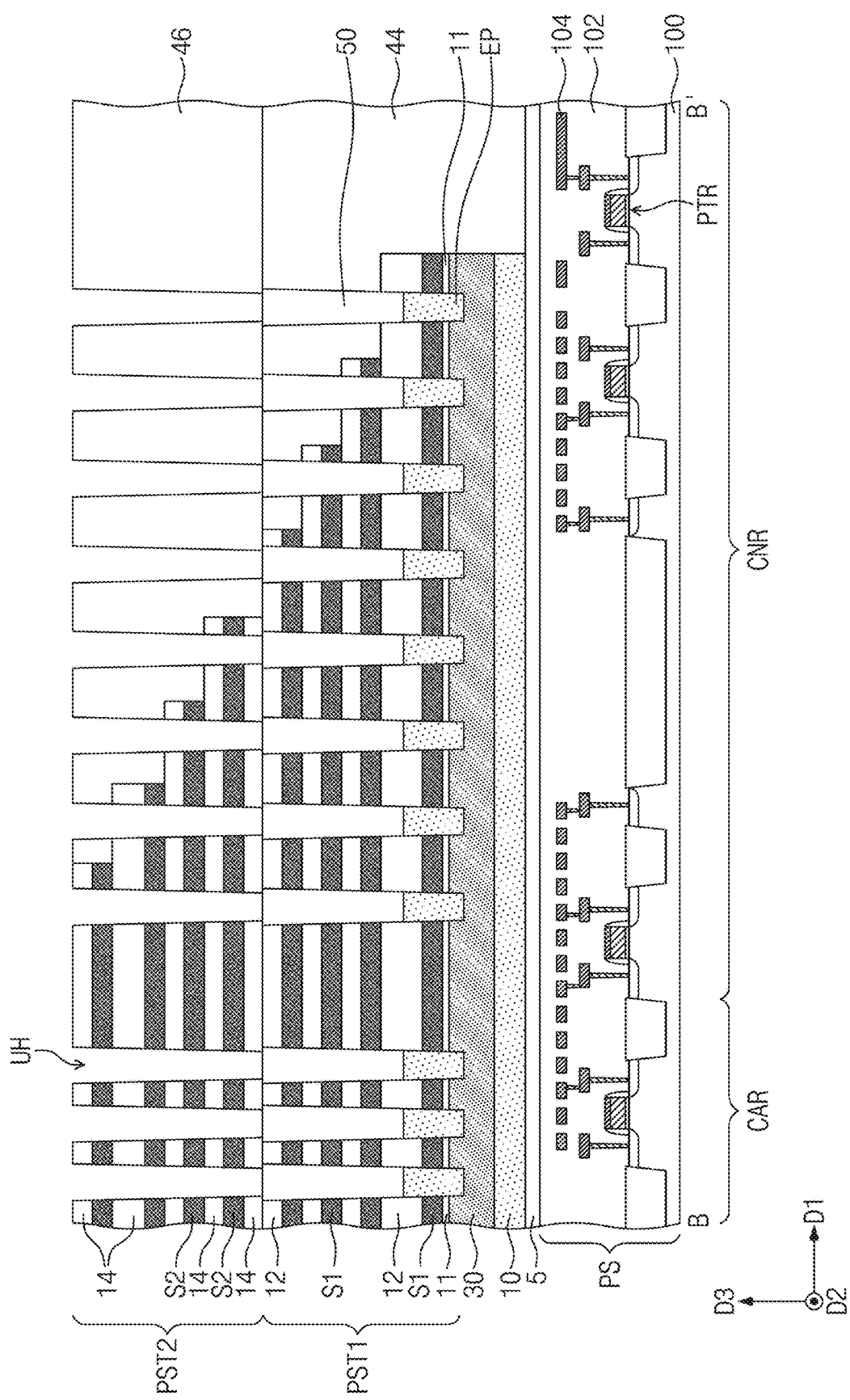

Referring to FIGS. 6A and 6B, a first preliminary stack structure PST1 may be formed by alternately and repeatedly stacking first sacrificial layers S1 and first electrode interlayer dielectric layers 12 on the buffer dielectric layer 11. The first sacrificial layers S1 may be formed of a material having an etch selectivity with respect to the buffer dielectric layer 11 and the first electrode interlayer dielectric layers 12. For example, the buffer dielectric layer 11 and the first electrode interlayer dielectric layers 12 may be formed of a silicon oxide layer, and the first sacrificial layers S1 may be formed of a silicon nitride layer.

A trimming process and an etching process may be alternately and repeatedly performed to allow the first preliminary stack structure PST1 to have a stepwise shape at its end portion on the connection region CNR. At this step, on the connection region CNR, the buffer dielectric layer 11, the carbon-containing layer 30, and the cell substrate 10 may also be etched to expose a top surface of the adhesive dielectric layer 5. A first planarized dielectric layer 44 may be formed on an entire surface of the adhesive dielectric layer 5, and then a chemical mechanical polishing (CMP) process may be performed to leave the first planarized dielectric layer 44 that covers the end portion of the first preliminary stack structure PST1. The first preliminary stack structure PST1 may be etched to form a plurality of lower holes BH. The lower holes BH may expose the carbon-containing layer 30. The lower holes BH may limit positions of cell vertical patterns VS and first and second dummy vertical patterns DVS1 and DVS2, which will be discussed below.

A selective epitaxial growth (SEG) process may be performed to form semiconductor patterns EP in the lower holes BH. The semiconductor patterns EP may be formed of a silicon layer that is epitaxially grown on the carbon-containing layer 30. As the silicon grains in the carbon-containing layer 30 have small sizes, the semiconductor pattern EP grown on the carbon-containing layer 30 may have the second grains GRA2 discussed with reference to FIG. 4B. During the selective epitaxial growth (SEG) process, the carbon-containing layer 30 may prevent shapes of the first grains GRA1 of the cell substrate 10 from transferring to the semiconductor patterns EP, and may cause the semiconductor pattern EP to have the second grains GRA2 whose sizes are less than those of the first grains GRA1. Accordingly, the semiconductor patterns EP may have uniform sizes and may thus have a reduced distribution in sizes. When the semiconductor pattern EP is formed, N-type or P-type impurities may be in-situ doped.

The lower holes BH may be filled with sacrificial buried patterns 50. The sacrificial buried patterns 50 may include a single-layered or multi-layered structure including at least one selected from an amorphous carbon layer (ACL), a spin-on-hardmask (SOH) layer, a spin-on-carbon (SOC) layer, and a silicon oxynitride layer.

A second preliminary stack structure PST2 may be formed by alternately and repeatedly stacking second sacrificial layers S2 and second electrode interlayer dielectric layers 14 on the first preliminary stack structure PST1. The second sacrificial layers S2 may include the same material as that of the first sacrificial layers S1. The second electrode interlayer dielectric layers 14 may include the same material as that of the first electrode interlayer dielectric layers 12. A trimming process and an etching process may be alternately and repeatedly performed to allow the second preliminary stack structure PST2 to have a stepwise shape at its end portion on the connection region CNR. This step may expose the end portion of the first preliminary stack structure PST1 and a top surface of the first planarized dielectric layer 44. A second planarized dielectric layer 46 may be formed on the second preliminary stack structure PST2, and then a chemical mechanical polishing (CMP) process may be performed to leave the second planarized dielectric layer 46 that covers the end portion of the second preliminary stack structure PST2. A groove may be formed by etching an uppermost one of the second sacrificial layers S2 and the second electrode interlayer dielectric layers 14 at the top of the second preliminary stack structure PST2, and then the groove may be at least partially filled with a dielectric material to form a separation dielectric pattern 9. The second preliminary stack structure PST2 may be etched to form a plurality of upper holes UH. The upper holes UH may expose corresponding sacrificial buried patterns 50.

Figure 7A:
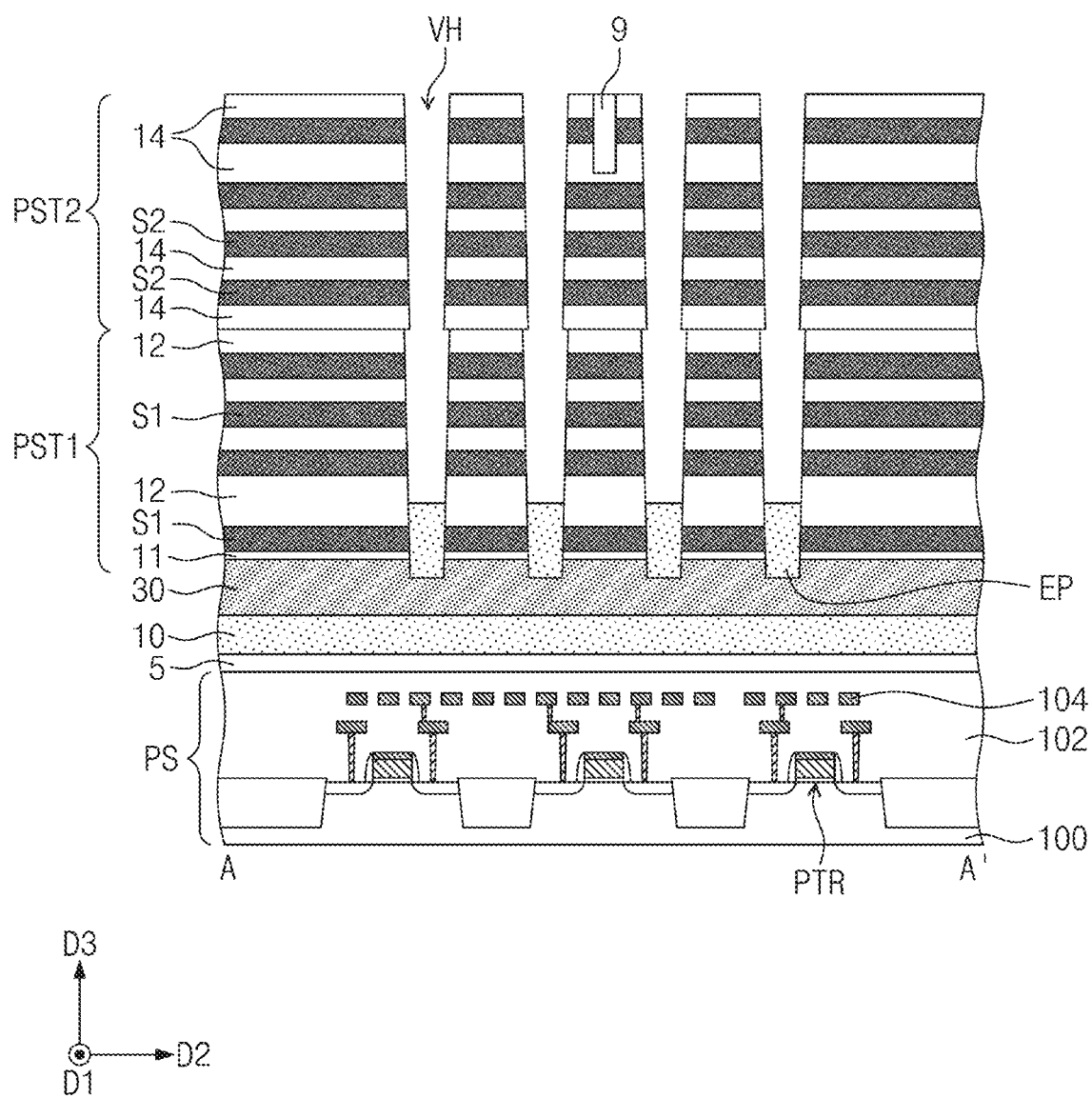
Figure 7B:
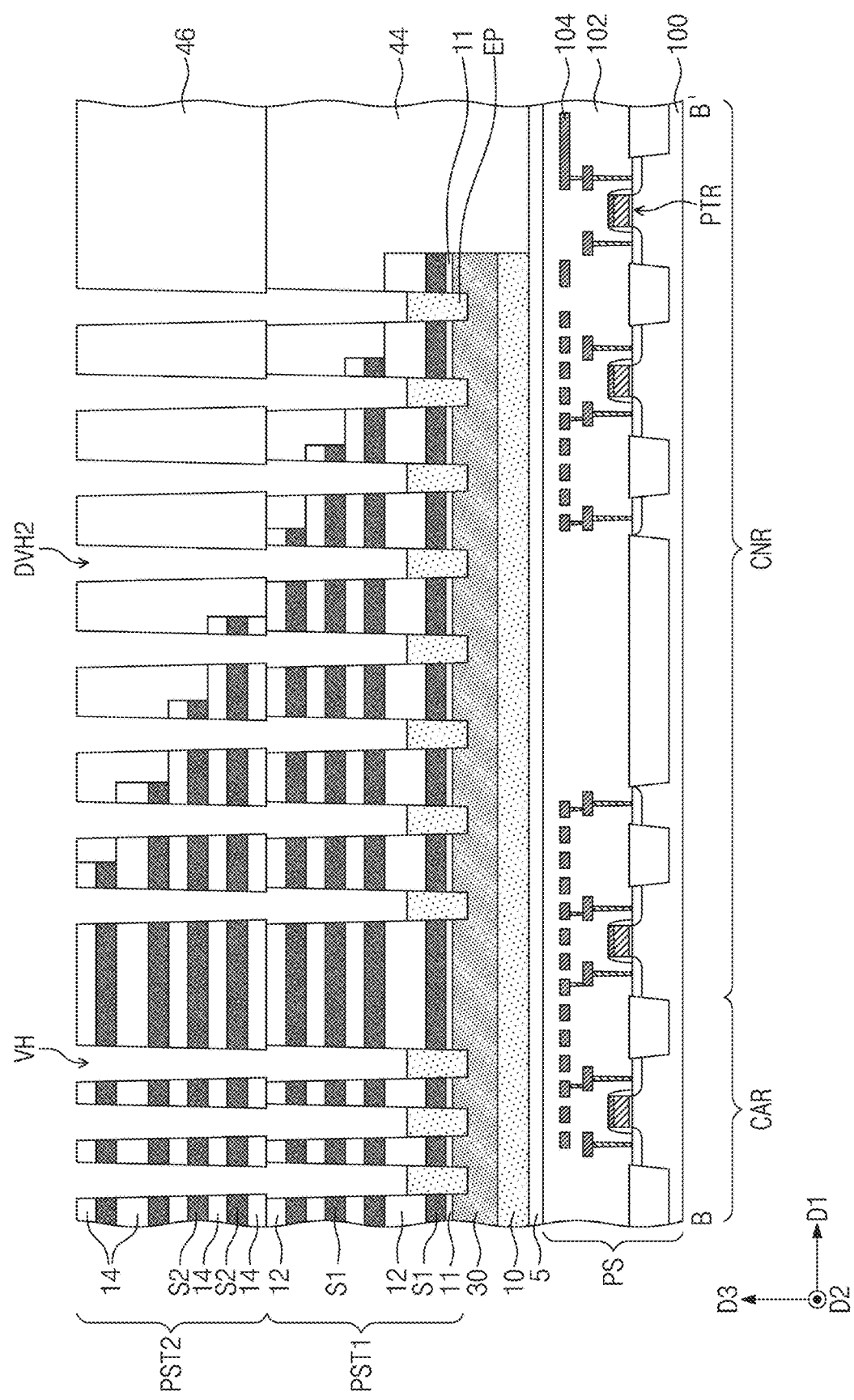

Referring to FIGS. 7A and 7B, the semiconductor patterns EP may be exposed by removing the sacrificial buried patterns 50 through the upper holes UH. Thus, the lower holes BH and their corresponding upper holes UH may be spatially connected to form vertical holes VH.

Figure 8A:
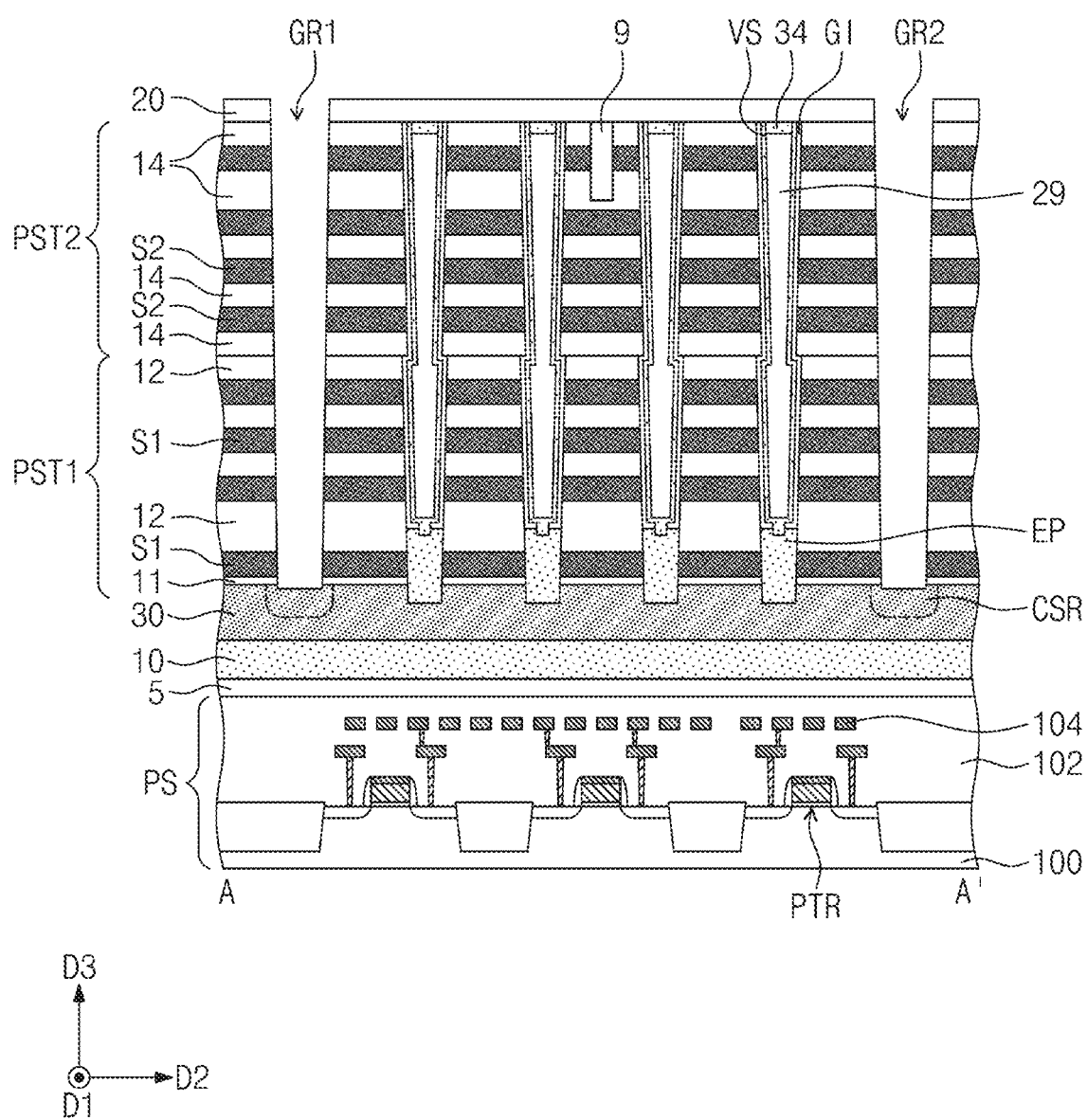
Figure 8B:
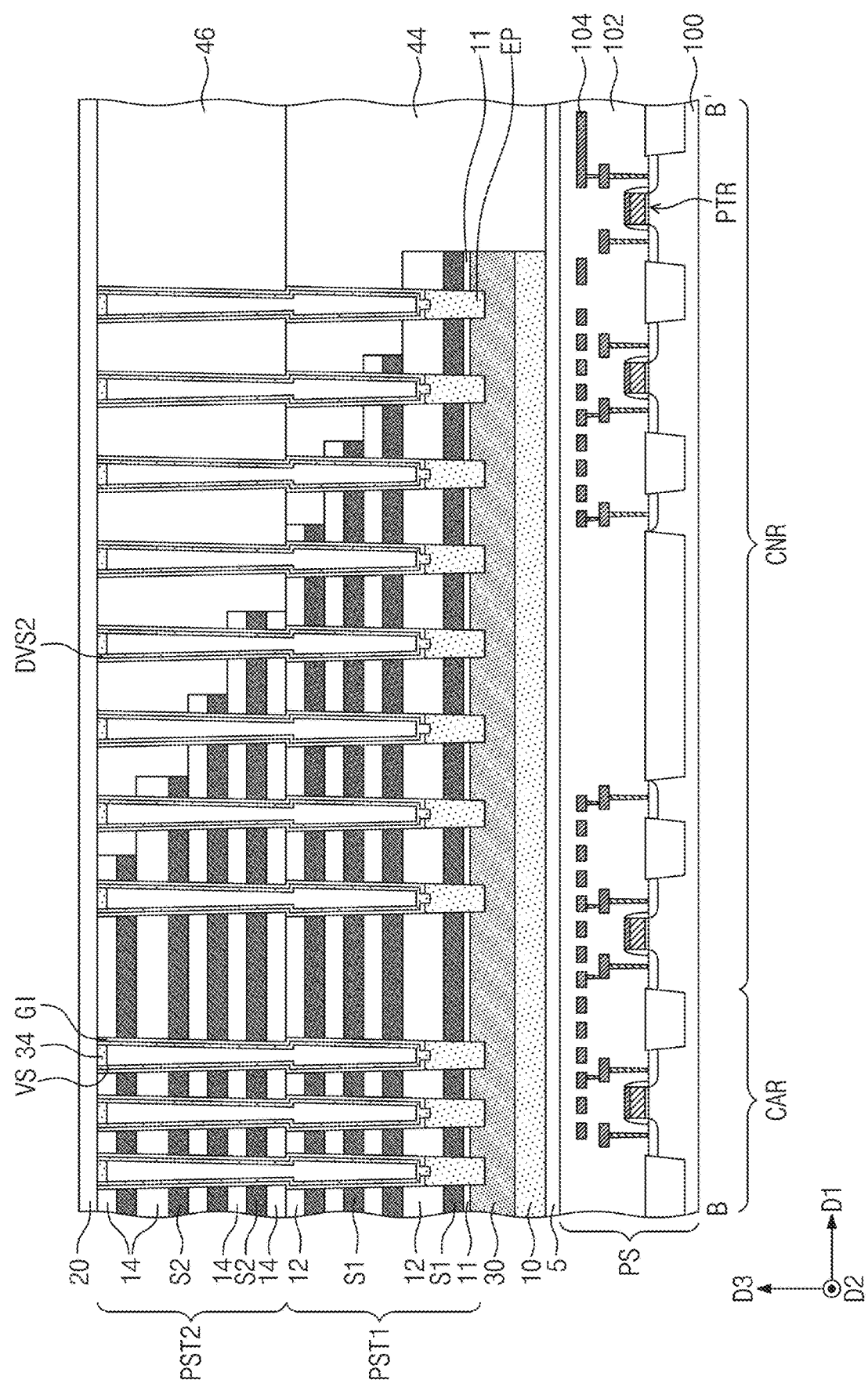
Figure 9A:
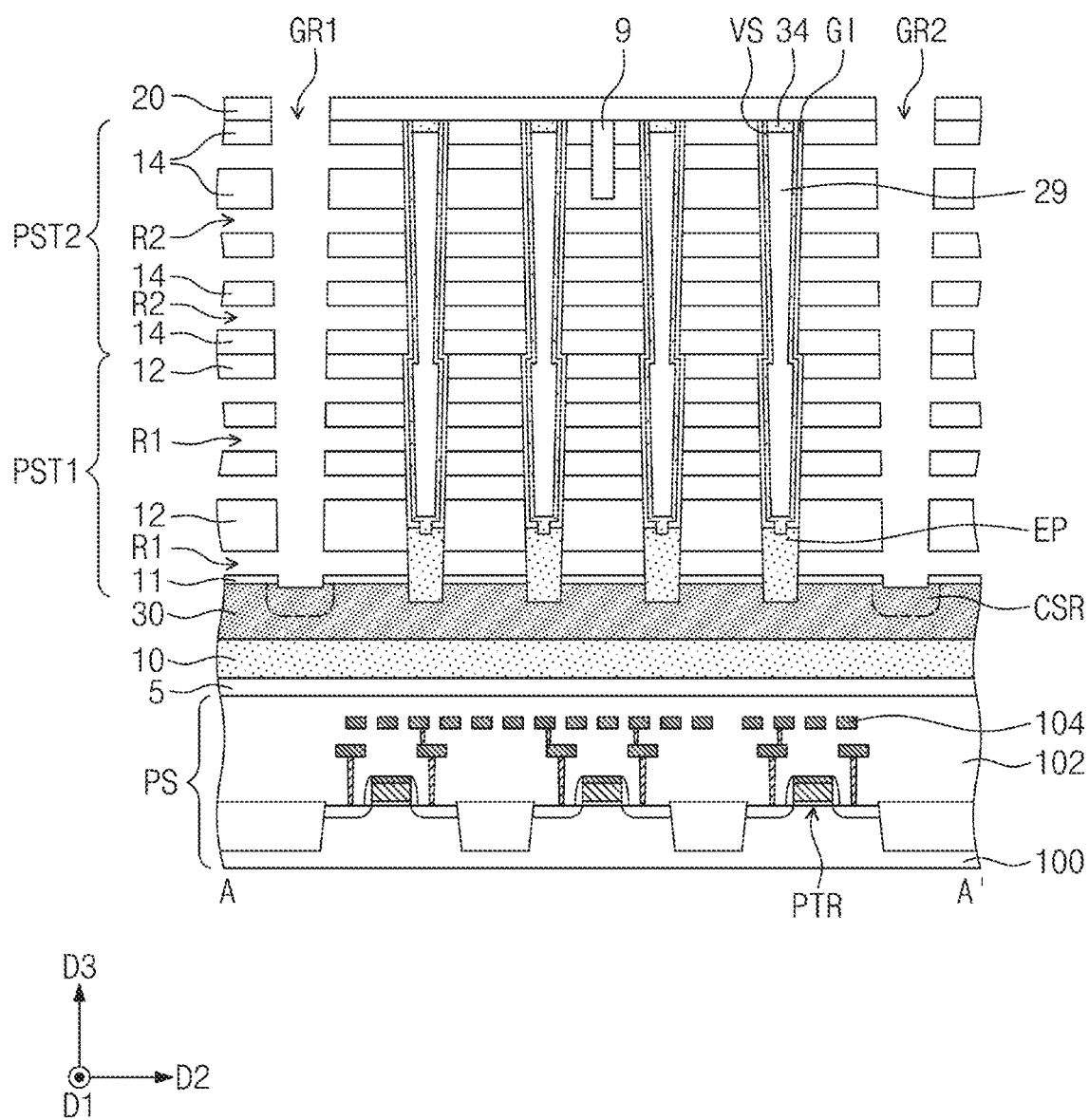
Figure 9B:
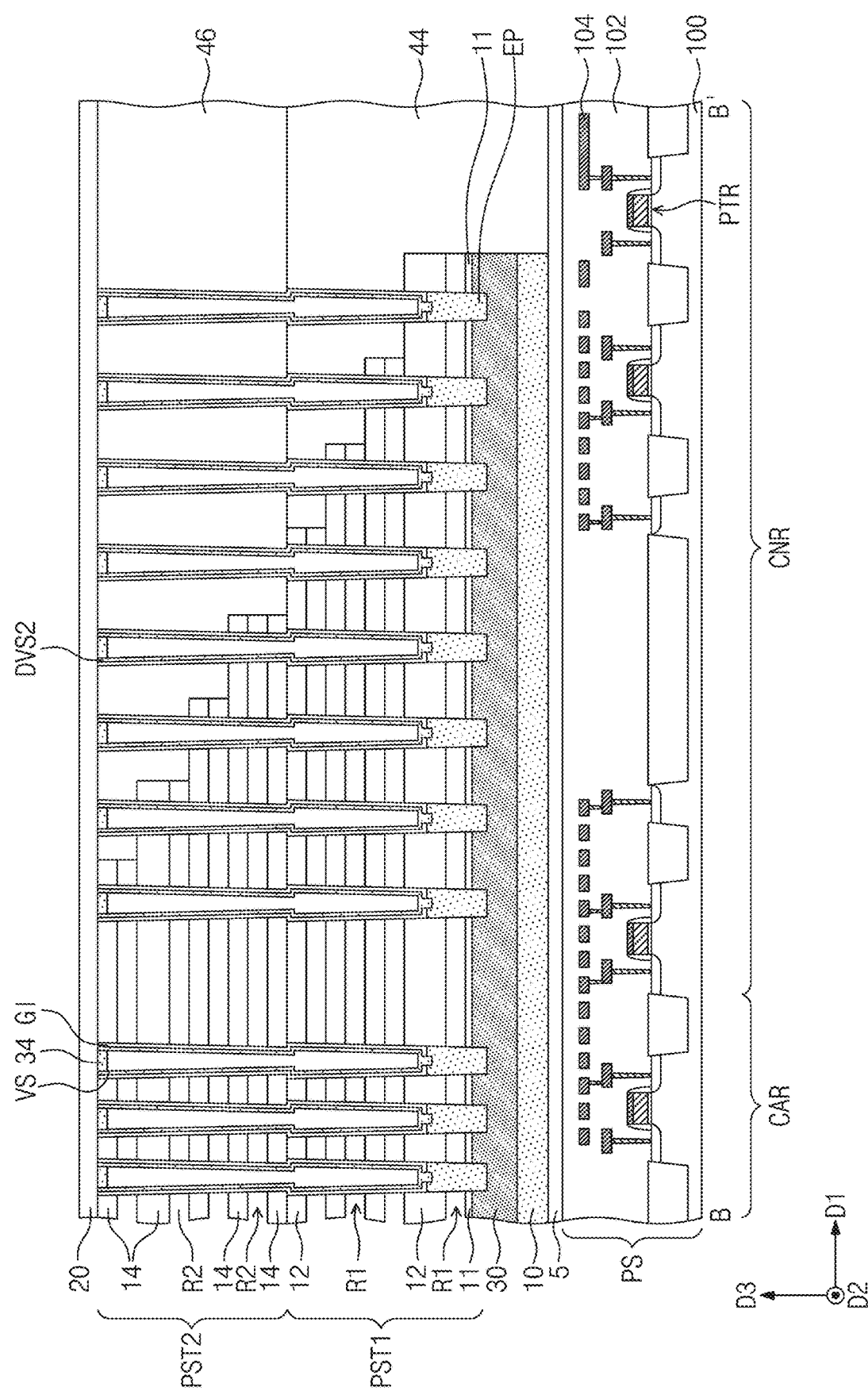
Figure 10A:
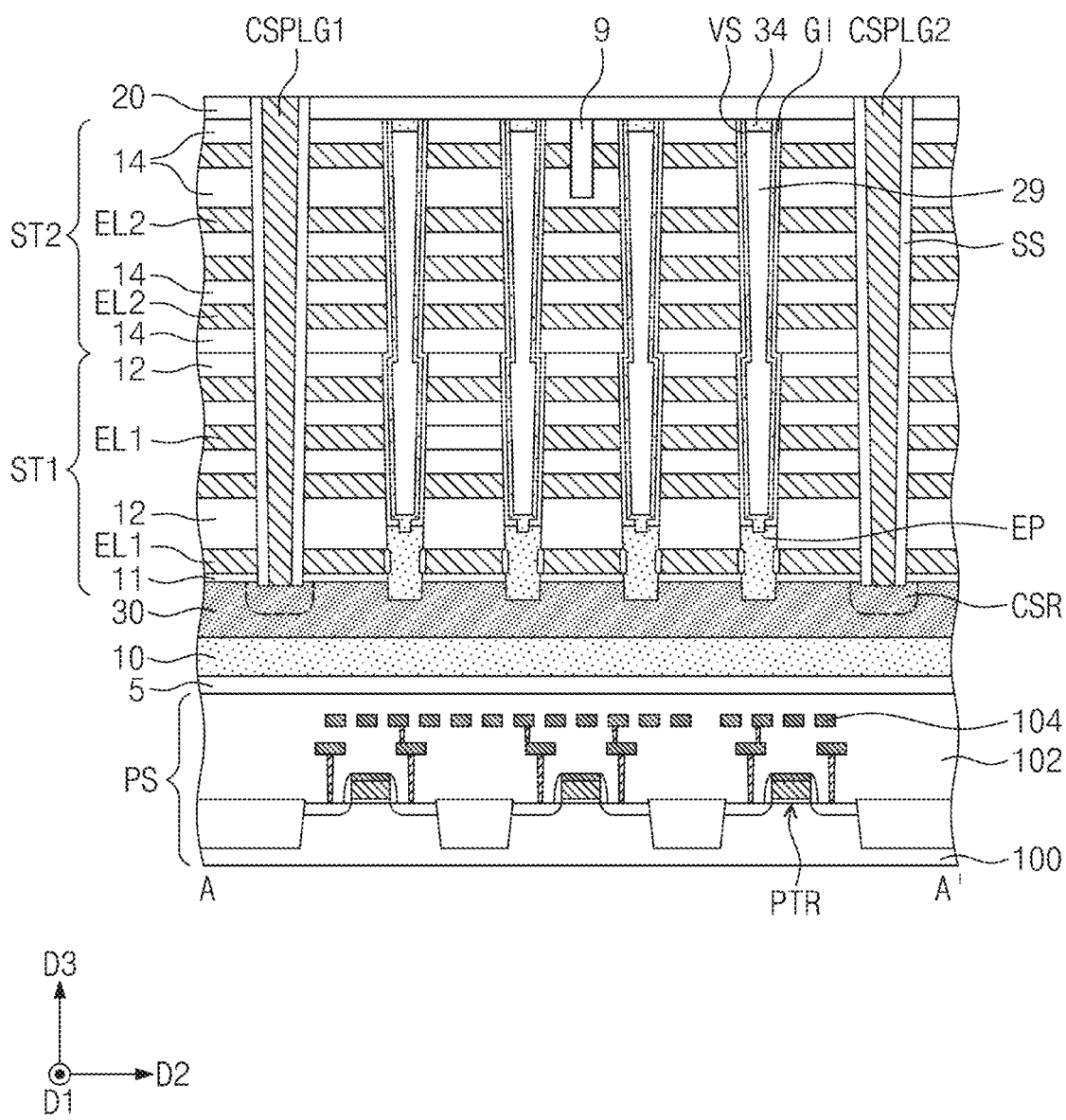
Figure 10B:
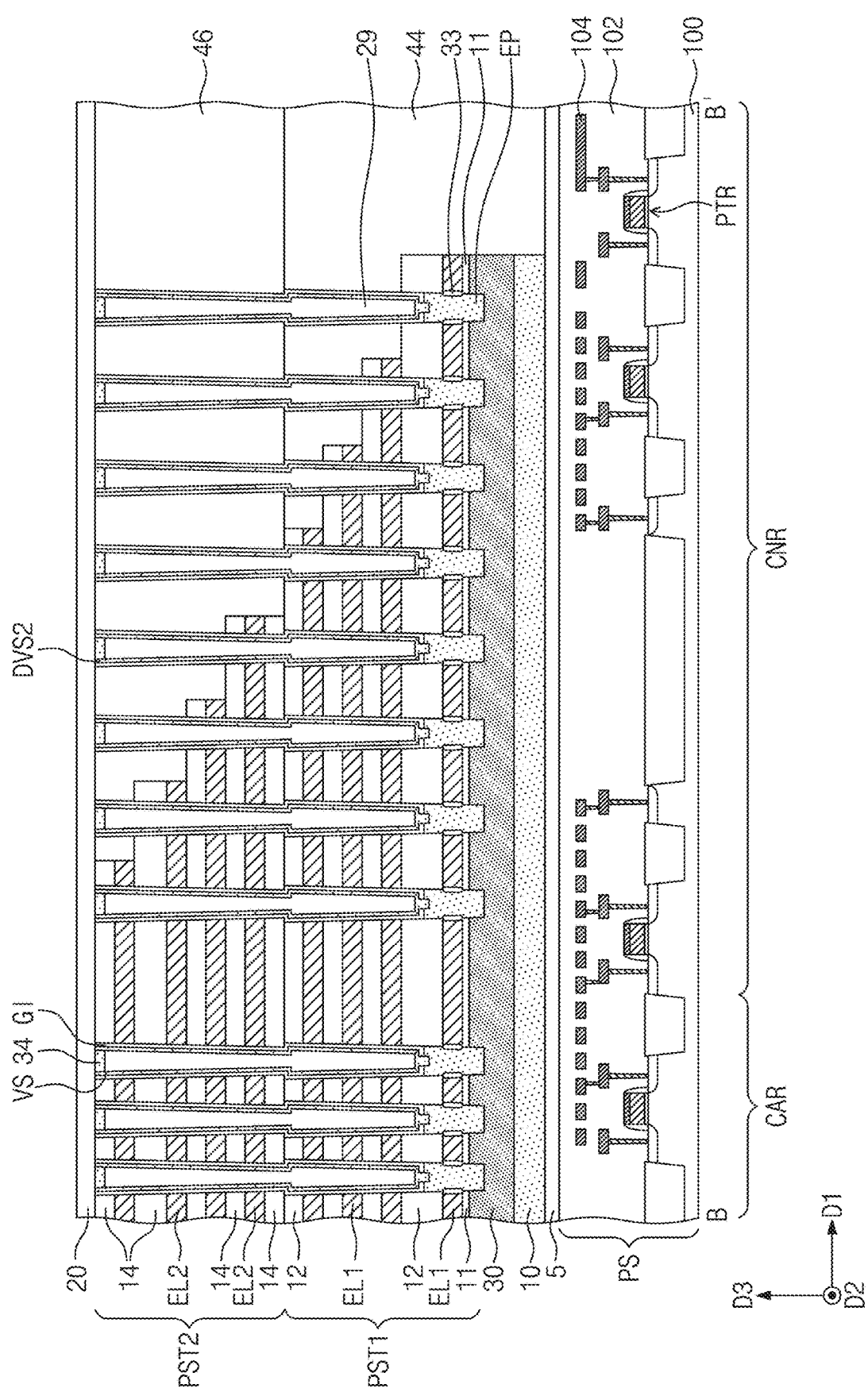

Referring to FIGS. 8A and 8B, gate dielectric layers GI may be formed to cover inner sidewalls of the vertical holes VH. A semiconductor layer may be conformally formed and a buried dielectric layer may be formed to fill the vertical holes VH. An etch-back process may be performed on the semiconductor layer and the buried dielectric layer such that cell vertical patterns VS, first and second dummy vertical patterns DVS1 and DVS2, and buried dielectric patterns 29 may be formed in the vertical holes VH. As the semiconductor patterns EP have sizes that are uniform due to the reduced distribution in sizes as discussed with reference to FIGS. 6A and 6B, when etching processes are performed to form the gate dielectric layers GI, the cell vertical patterns VS, and the first and second dummy vertical patterns DVS1 and DVS2, it may be possible to obtain uniform etching depths and thus to prevent the occurrence of process defects.

An upper portion of the buried dielectric pattern 29 may be recessed, and then the recessed portion may be filled with a conductive layer to form a bit-line conductive pad 34. A first interlayer dielectric layer 20 may be formed on the second preliminary stack structure PST2. On the cell region CAR, the first interlayer dielectric layer 20, the second preliminary stack structure PST2, and the first preliminary stack structure PST1 may be etched to form a first groove GR1 and a second groove GR2 that expose the carbon-containing layer 30. An ion implantation process may be performed in which the first groove GR1 and the second groove GR2 are used to form common source regions CSR in the carbon-containing layer 30.

Referring to FIGS. 8A, 8B, 9A, and 9B, the first sacrificial layers S1 and the second sacrificial layers S2 may be removed through the first groove GR1 and the second groove GR2. Therefore, first empty spaces R1 may be formed at locations where the first sacrificial layers S1 have been positioned, and second empty spaces R2 may be formed at locations where the second sacrificial layers S2 have been positioned. The first empty spaces R1 may expose sidewalls of the semiconductor patterns EP and/or top and bottom surfaces of the first electrode interlayer dielectric layers 12. The second empty spaces R2 may expose top and bottom surfaces of the second electrode interlayer dielectric layers 14.

Referring to FIGS. 9A, 9B, 10A, and 10B, a thermal oxidation process may be performed to form ground gate dielectric layers 33 on the sidewalls of the semiconductor patterns EP. A high-k dielectric layer (see HL of FIG. 4C) may be conformally formed and a conductive layer may be deposited, and thus the first and second empty spaces R1 and R2 may be filled with the high-k dielectric layer HL and the conductive layer. The conductive layer may be removed from the first and second grooves GR1 and GR2, such that first electrode layers EL1 and second electrode layers EL2 may be respectively formed in the first empty spaces R1 and the second empty spaces R2. A plurality of dielectric spacers SS may be formed to cover or overlap inner sidewalls of the first and second grooves GR1 and GR2, and then first and second source contact plugs CSPLG1 and CSPLG2 may be formed in the first and second grooves GR1 and GR2.

Subsequently, referring to FIGS. 3A and 3B, a second interlayer dielectric layer 22 may be formed on the first interlayer dielectric layer 20. On the cell region CAR, a bit-line plug BPLG may be formed to penetrate the second interlayer dielectric layer 22 and the first interlayer dielectric layer 20. On the connection region CNR, a through via TVS may be formed. Thereafter, bit line BL, a conductive pad 39, various lines 35, 36, and 38, and third and fourth interlayer dielectric layers 24 and 26 may be formed.

Figure 11A:
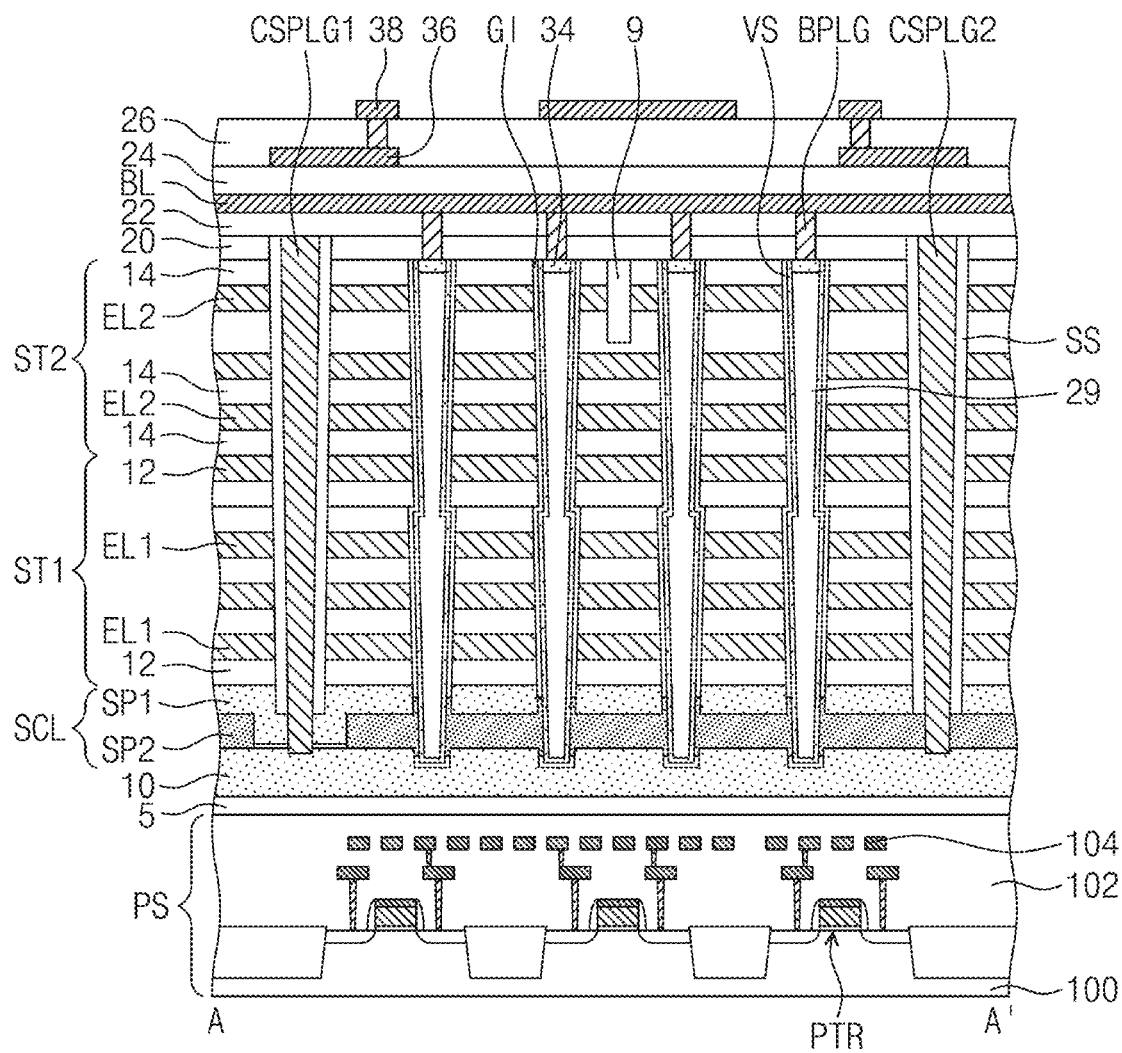
FIG. 11A illustrates a cross-sectional view taken along line A-A' of FIG. 2, showing a three-dimensional semiconductor memory device according to some example embodiments of the present inventive concepts.
Figure 11A:
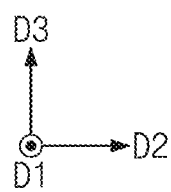
Figure 11B:
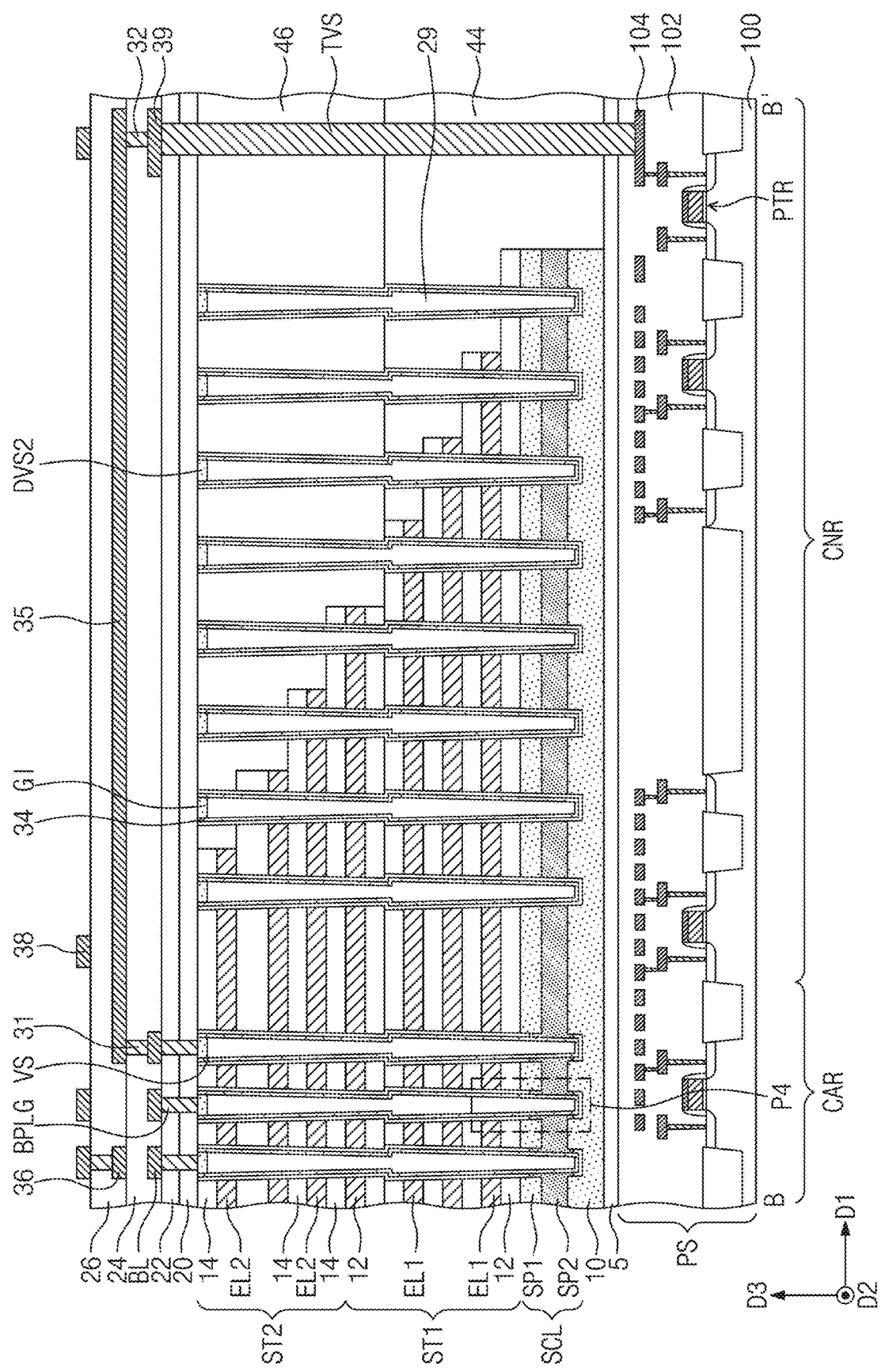
FIG. 11B illustrates a cross-sectional view taken along line B-B' of FIG. 2, showing a three-dimensional semiconductor memory device according to some example embodiments of the present inventive concepts.
Figure 12:
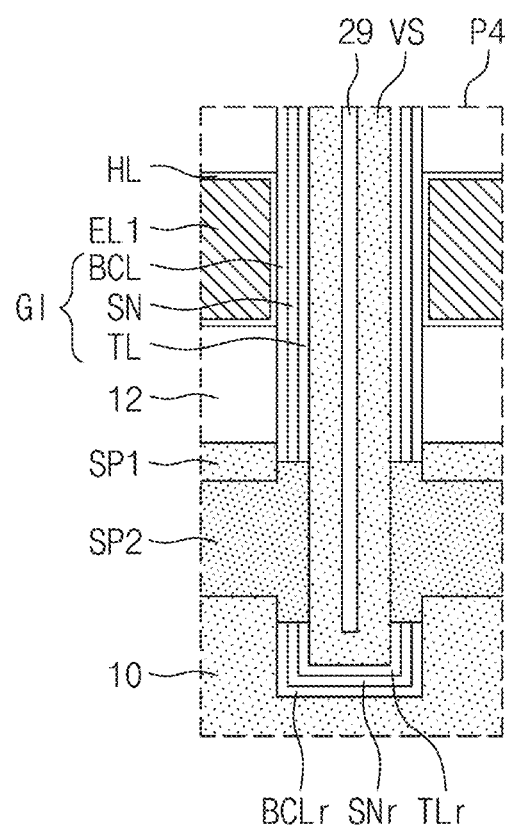
FIG. 12 illustrates an enlarged view showing section P4 of FIG. 11B.

FIG. 11A illustrates a cross-sectional view taken along line A-A' of FIG. 2, showing a three-dimensional semiconductor memory device according to some example embodiments of the present inventive concepts. FIG. 11B illustrates a cross-sectional view taken along line B-B' of FIG. 2, showing a three-dimensional semiconductor memory device according to some example embodiments of the present inventive concepts. FIG. 12 illustrates an enlarged view showing section P4 of FIG. 11B.

Referring to FIGS. 11A and 11B, a cell array structure CS may be stacked on a peripheral circuit structure PS. The cell array structure CS may be similar to that shown in FIGS. 3A and 3B, but may differ in that a source layer SCL is interposed between the first stack structure ST1 and the cell substrate 10. The source layer SCL may include a first source pattern SP1 and a second source pattern SP2 below the first source pattern SP1. The first electrode interlayer dielectric layer 12 may be interposed between the first source pattern SP1 and the first electrode layer EL1. The first and second source patterns SP1 and SP2 may each include, for example, a polysilicon pattern or a single-crystalline silicon pattern doped with N-type or P-type impurities. The second source pattern SP2 may further include carbon. The second source pattern SP2 may correspond to the carbon-containing layer 30 of FIGS. 3A and 3B. The second source pattern SP2 may contain carbon whose concentration is in a range of from about 3 at % to about 15 at %.

Referring to FIG. 12, the second source pattern SP2 may penetrate the gate dielectric layer GI and may contact each of the cell vertical patterns VS. A residual tunnel dielectric layer TLr, a residual charge storage layer SNr, and a residual blocking dielectric layer BCLr may be interposed between the cell substrate 10 and each of the cell vertical patterns VS.

In some embodiments, the cell substrate 10 may have the first grains GRA1 discussed with reference to FIG. 4A. The cell vertical patterns VS may each have the second grains GRA2 discussed with reference to FIG. 4B. Other configurations may be identical or similar to those discussed with reference to FIGS. 3A, 3B, 4A, and 4B.

The following will describe a method of fabricating a three-dimensional semiconductor memory device of FIGS. 11A and 11B. Referring to FIGS. 6A and 6B, without forming the carbon-containing layer 30, a sacrificial source layer (not shown) and the first source pattern SP1 may be sequentially formed on the cell substrate 10. The first and second preliminary stack structures PST1 and PST2 may be formed on the first source pattern SP1. At this step, the semiconductor patterns EP may not be formed. Referring to FIGS. 9A, 9B, 10A, and 10B, the first and second electrode layers EL1 and EL2 may be formed, and then the sacrificial source layer may be removed to form the second source pattern SP2 at a location where the sacrificial source layer has been positioned. The second source pattern SP2 may be formed of a semiconductor layer doped with carbon and N-type or P-type impurities. A polysilicon layer included in the cell vertical pattern VS may be crystallized in subsequent processes, such as a high-temperature process for forming wiring lines. As the cell vertical pattern VS contacts the second source pattern SP2 containing carbon, the cell vertical pattern VS may have the small-sized second grains GRA2 shown in FIG. 4B. Other configurations may be identical or similar to those discussed with reference to FIGS. 5A to 10B.

A three-dimensional semiconductor memory device according to the present inventive concepts may include a carbon-containing layer between semiconductor patterns and a substrate that consists of a polycrystalline semiconductor layer. Therefore, the carbon-containing layer may cause the semiconductor patterns to each have second grains whose average size is less than that of first grains that are included in the substrate. Accordingly, the semiconductor patterns may be formed to have uniform sizes and reduced size distribution. As a result, it may be possible to decrease process defects and to increase reliability of semiconductor memory devices.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A three-dimensional semiconductor memory device, comprising:
   a carbon-containing layer on a substrate;
   a plurality of electrode interlayer dielectric layers and a plurality of electrode layers that are alternately stacked on the carbon-containing layer;
   a cell vertical pattern that penetrates at least some of the electrode interlayer dielectric layers and the electrode layers; and
   a semiconductor pattern between the cell vertical pattern and the carbon-containing layer,
   wherein the substrate comprises a plurality of first grains,
   wherein the semiconductor pattern comprises a plurality of second grains, and
   wherein an average size of the second grains is less than an average size of the first grains.

2. The three-dimensional semiconductor memory device of claim 1,
   wherein the substrate comprises a plurality of first grain boundaries delineating the plurality of first grains,
   wherein the semiconductor pattern comprises a plurality of second grain boundaries delineating the plurality of second grains, and
   wherein a density of the second grain boundaries is greater than a density of the first grain boundaries.

3. The three-dimensional semiconductor memory device of claim 1,
   wherein the average size of the first grains is in a range of about 50 nm to about 400 nm, and
   wherein the average size of the second grains is in a range of about 8 nm to about 12 nm.

4. The three-dimensional semiconductor memory device of claim 1, wherein a concentration of carbon in the carbon-containing layer is in a range of about 3 at % to about 15 at %.

5. The three-dimensional semiconductor memory device of claim 1, wherein the carbon-containing layer contacts a lower sidewall of the semiconductor pattern.

6. The three-dimensional semiconductor memory device of claim 1, further comprising:
   a peripheral circuit structure opposite the substrate from the cell vertical pattern and electrically connected to the cell vertical pattern or at least one of the electrode layers.

7. The three-dimensional semiconductor memory device of claim 1, further comprising:
   a source contact plug spaced apart from the cell vertical pattern, the source contact plug penetrating the electrode interlayer dielectric layers and the electrode layers and contacting the carbon-containing layer.

8. A three-dimensional semiconductor memory device, comprising:
   a peripheral circuit structure;
   a substrate and a carbon-containing layer that are sequentially stacked on the peripheral circuit structure;
   a stack structure on the carbon-containing layer, the stack structure comprising a plurality of electrode interlayer dielectric layers and a plurality of electrode layers that are alternately stacked;
   a cell vertical pattern that penetrates at least a portion of the stack structure;
   a gate dielectric layer between the cell vertical pattern and the electrode layers; and
   a source contact plug spaced apart from the cell vertical pattern, the source contact plug penetrating the stack structure and contacting the carbon-containing layer,
   wherein a concentration of carbon in the carbon-containing layer is in a range of about 3 at % to about 15 at %.

9. The three-dimensional semiconductor memory device of claim 8, further comprising:
   a semiconductor pattern between the cell vertical pattern and the carbon-containing layer,
   wherein the substrate comprises a plurality of first grains, wherein the semiconductor pattern comprises a plurality of second grains, and wherein an average size of the first grains is greater than an average size of the second grains.

10. The three-dimensional semiconductor memory device of claim 9, wherein the substrate comprises a plurality of first grain boundaries delineating the plurality of first grains, wherein the semiconductor pattern comprises a plurality of second grain boundaries delineating the plurality of second grains, and wherein a density of the second grain boundaries is greater than a density of the first grain boundaries.

11. The three-dimensional semiconductor memory device of claim 9, wherein the average size of the first grains is in a range of about 50 nm to about 400 nm, and wherein the average size of the second grains is in a range of about 8 nm to about 12 nm.

12. The three-dimensional semiconductor memory device of claim 8, further comprising:

a source pattern between the stack structure and the carbon-containing layer, wherein the carbon-containing layer penetrates the gate dielectric layer and contacts a sidewall of the cell vertical pattern.

13. The three-dimensional semiconductor memory device of claim 8, wherein the substrate comprises a cell region and a connection region, wherein the stack structure comprises a stepwise shape on the connection region, and wherein the three-dimensional semiconductor memory device further comprises:

a planarized dielectric layer that is on an end portion of the stack structure on the connection region; and a through via that penetrates the planarized dielectric layer and is electrically connected with the peripheral circuit structure.

14. The three-dimensional semiconductor memory device of claim 8, wherein the stack structure comprises:

a first stack structure adjacent to the carbon-containing layer; and a second stack structure on the first stack structure, wherein a sidewall of the cell vertical pattern has a profile that is bent adjacent to a boundary between the first stack structure and the second stack structure.

15. A three-dimensional semiconductor memory device, comprising:

a peripheral circuit structure;

a substrate and a carbon-containing layer that are sequentially stacked on the peripheral circuit structure;

a stack structure on the carbon-containing layer, the stack structure comprising a plurality of electrode interlayer dielectric layers and a plurality of electrode layers that are alternately stacked;

a cell vertical pattern that penetrates at least a portion of the stack structure; and a semiconductor pattern between the cell vertical pattern and the carbon-containing layer, wherein each of the substrate and the semiconductor pattern comprises a polycrystalline silicon layer, wherein the substrate comprises a plurality of first grain boundaries, wherein the semiconductor pattern comprises a plurality of second grain boundaries, and wherein a density of the second grain boundaries is greater than a density of the first grain boundaries.

16. The three-dimensional semiconductor memory device of claim 15, wherein the substrate comprises a plurality of first grains defined by the plurality of first grain boundaries, wherein the semiconductor pattern comprises a plurality of second grains defined by the plurality of second grain boundaries, and wherein an average size of the first grains is greater than an average size of the second grains.

17. The three-dimensional semiconductor memory device of claim 15, further comprising:

a source contact plug spaced apart from the cell vertical pattern, the source contact plug penetrating the stack structure and contacting the carbon-containing layer; and a common source region in the carbon-containing layer and below the source contact plug, wherein the common source region comprises N-type or P-type impurities.

18. The three-dimensional semiconductor memory device of claim 15, wherein a concentration of carbon in the carbon-containing layer is in a range of about 3 at % to about 15 at %.

19. The three-dimensional semiconductor memory device of claim 15, wherein the carbon-containing layer contacts a lower sidewall and a bottom portion of the semiconductor pattern.

20. The three-dimensional semiconductor memory device of claim 15, wherein the peripheral circuit structure is opposite the substrate from the carbon-containing layer and is electrically connected to the cell vertical pattern or at least one of the electrode layers.

* * * * *